United States Patent
Lin et al.

(10) Patent No.: US 10,134,711 B2
(45) Date of Patent: Nov. 20, 2018

(54) THERMALLY ENHANCED SEMICONDUCTOR ASSEMBLY WITH THREE DIMENSIONAL INTEGRATION AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 15/473,629

(22) Filed: Mar. 30, 2017

(65) Prior Publication Data

US 2017/0207200 A1    Jul. 20, 2017

Related U.S. Application Data

(63) Continuation-in-part of application No. 15/462,536, filed on Mar. 17, 2017, and a continuation-in-part of
(Continued)

(51) Int. Cl.
*H01L 25/065* (2006.01)
*H01L 25/00* (2006.01)
(Continued)

(52) U.S. Cl.
CPC ...... *H01L 25/0657* (2013.01); *H01L 21/4817* (2013.01); *H01L 21/50* (2013.01); *H01L 21/561* (2013.01); *H01L 21/6835* (2013.01); *H01L 23/055* (2013.01); *H01L 23/13* (2013.01); *H01L 23/16* (2013.01); *H01L 23/36* (2013.01); *H01L 23/544* (2013.01); *H01L 24/19* (2013.01); *H01L 24/20* (2013.01); *H01L 24/97* (2013.01); *H01L 25/50* (2013.01); *H01L 21/568* (2013.01); *H01L 23/3128* (2013.01); *H01L 23/49816* (2013.01);
(Continued)

(58) Field of Classification Search
None
See application file for complete search history.

(56) References Cited

U.S. PATENT DOCUMENTS

| 5,583,377 A | 12/1996 | Higgins, III |
| 5,790,384 A | 8/1998 | Ahmad et al. |

(Continued)

*Primary Examiner* — Matthew Reames
*Assistant Examiner* — Steven B Gauthier
(74) *Attorney, Agent, or Firm* — Pai Patent & Trademark Law Firm; Chao-Chang David Pai

(57) ABSTRACT

A thermally enhanced semiconductor assembly with three dimensional integration includes a stacked semiconductor sub-assembly electrically coupled to a wiring board by bonding wires. A heat spreader that provides an enhanced thermal characteristic for the stacked semiconductor sub-assembly is disposed in a through opening of a wiring structure. Another wiring structure disposed on the heat spreader not only provides mechanical support, but also allows heat spreading and electrical grounding for the heat spreader by metallized vias. The bonding wires provide electrical connections between the sub-assembly and the wiring board for interconnecting devices assembled in the sub-assembly to terminal pads provided in the wiring board.

7 Claims, 15 Drawing Sheets

Related U.S. Application Data application No. 15/415,844, filed on Jan. 25, 2017, and a continuation-in-part of application No. 15/415,846, filed on Jan. 25, 2017, said application No. 15/415,844 is a continuation-in-part of application No. 15/353,537, filed on Nov. 16, 2016, said application No. 15/415,846 is a continuation-in-part of application No. 15/353,537, filed on Nov. 16, 2016, said application No. 15/462,536 is a continuation-in-part of application No. 15/353,537, filed on Nov. 16, 2016, application No. 15/473,629, which is a continuation-in-part of application No. 15/353,537, filed on Nov. 16, 2016, said application No. 15/462,536 is a continuation-in-part of application No. 15/289,126, filed on Oct. 8, 2016, application No. 15/473,629, which is a continuation-in-part of application No. 15/289,126, filed on Oct. 8, 2016, said application No. 15/353,537 is a continuation-in-part of application No. 15/289,126, filed on Oct. 8, 2016, said application No. 15/415,844 is a continuation-in-part of application No. 15/289,126, filed on Oct. 8, 2016, said application No. 15/415,846 is a continuation-in-part of application No. 15/269,126, filed on Sep. 19, 2016, said application No. 15/415,844 is a continuation-in-part of application No. 15/166,185, filed on May 26, 2016, said application No. 15/462,536 is a continuation-in-part of application No. 15/166,185, filed on May 26, 2016, said application No. 15/415,846 is a continuation-in-part of application No. 15/166,185, filed on May 26, 2016, application No. 15/473,629, which is a continuation of application No. 15/166,185, filed on May 26, 2016, said application No. 15/353,537 is a continuation-in-part of application No. 15/166,185, filed on May 26, 2016, said application No. 15/289,126 is a continuation-in-part of application No. 15/166,185, filed on May 26, 2016.

(60) Provisional application No. 62/166,771, filed on May 27, 2015.

(51) Int. Cl.

| | | |
|---|---|---|
| *H01L 23/13* | (2006.01) | |
| *H01L 23/16* | (2006.01) | |
| *H01L 21/56* | (2006.01) | |
| *H01L 23/36* | (2006.01) | |
| *H01L 23/544* | (2006.01) | |
| *H01L 21/683* | (2006.01) | |
| *H01L 21/48* | (2006.01) | |
| *H01L 21/50* | (2006.01) | |
| *H01L 23/055* | (2006.01) | |
| *H01L 23/31* | (2006.01) | |
| *H01L 23/00* | (2006.01) | |
| *H01L 23/498* | (2006.01) | |

(52) U.S. Cl.
CPC ........ *H01L 23/49822* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2221/68359* (2013.01); *H01L 2221/68381* (2013.01); *H01L 2223/54426* (2013.01); *H01L 2223/54486* (2013.01); *H01L 2224/04105* (2013.01); *H01L 2224/12105* (2013.01); *H01L 2224/16227* (2013.01); *H01L 2224/16235* (2013.01); *H01L 2224/32225* (2013.01); *H01L 2224/32245* (2013.01); *H01L 2224/73253* (2013.01); *H01L 2224/73267* (2013.01); *H01L 2224/81005* (2013.01); *H01L 2224/81203* (2013.01); *H01L 2224/81207* (2013.01); *H01L 2224/81815* (2013.01); *H01L 2224/83005* (2013.01); *H01L 2224/8314* (2013.01); *H01L 2224/92225* (2013.01); *H01L 2224/92244* (2013.01); *H01L 2224/97* (2013.01); *H01L 2225/0651* (2013.01); *H01L 2225/06513* (2013.01); *H01L 2225/06558* (2013.01); *H01L 2225/06572* (2013.01); *H01L 2225/06582* (2013.01); *H01L 2225/06589* (2013.01); *H01L 2924/15153* (2013.01); *H01L 2924/15311* (2013.01); *H01L 2924/3025* (2013.01); *H01L 2924/3511* (2013.01); *H01L 2924/37001* (2013.01)

(56) References Cited

U.S. PATENT DOCUMENTS

| | | |
|---|---|---|
| 5,801,072 A | 9/1998 | Barber |
| 5,977,640 A | 11/1999 | Bertin et al. |
| 6,084,308 A | 7/2000 | Kelkar et al. |
| 6,091,138 A | 7/2000 | Yu et al. |
| 6,150,724 A | 11/2000 | Wenzel et al. |
| 6,204,562 B1 | 3/2001 | Ho et al. |
| 6,365,963 B1 | 4/2002 | Shimada |
| 6,369,448 B1 | 4/2002 | McCormick |
| 6,376,917 B1 | 4/2002 | Takeshita et al. |
| 6,495,910 B1 | 12/2002 | Wu |
| 6,507,115 B1 | 1/2003 | Hofstee et al. |
| 6,555,917 B1 | 4/2003 | Heo |
| 6,563,205 B1 | 5/2003 | Fogal et al. |
| 6,586,836 B1 | 7/2003 | Ma et al. |
| 6,659,512 B1 | 12/2003 | Harper et al. |
| 6,768,208 B2 | 7/2004 | Lin et al. |
| 6,844,619 B2 | 1/2005 | Tago |
| 6,861,750 B2 | 3/2005 | Zhao et al. |
| 6,870,248 B1 | 3/2005 | Shibata |
| 6,906,408 B2 | 6/2005 | Cloud et al. |
| 6,984,544 B2 | 1/2006 | Cloud et al. |
| 7,002,254 B2 | 2/2006 | Harper et al. |
| 7,026,719 B2 | 4/2006 | Wang |
| 7,087,988 B2 | 8/2006 | Hosomi |
| 7,198,980 B2 | 4/2007 | Jiang et al. |
| 7,202,559 B2 | 4/2007 | Zhao et al. |
| 7,205,646 B2 | 4/2007 | Lin et al. |
| 7,218,005 B2 | 5/2007 | Tago |
| 7,462,933 B2 | 12/2008 | Zhao et al. |
| 7,554,194 B2 | 6/2009 | Kelly et al. |
| 7,573,136 B2 | 8/2009 | Jiang et al. |
| 7,592,689 B2 | 9/2009 | Brunnbauer |
| 7,859,120 B2 | 12/2010 | Choi et al. |
| 7,919,853 B1 | 4/2011 | Lee |
| 7,944,043 B1 | 5/2011 | Chung et al. |
| 8,008,121 B2 | 8/2011 | Choi et al. |
| 8,022,555 B2 | 9/2011 | Hwang et al. |
| 8,035,216 B2 | 10/2011 | Skeete |
| 8,143,097 B2 | 3/2012 | Chi et al. |
| 8,148,806 B2 | 4/2012 | Lin et al. |
| 8,188,379 B2 | 5/2012 | Hsu |
| 8,227,904 B2 | 7/2012 | Braunisch et al. |
| 8,288,854 B2 | 10/2012 | Weng et al. |
| 8,421,222 B2 | 4/2013 | Lin et al. |
| 8,519,537 B2 | 8/2013 | Jeng et al. |
| 8,525,317 B1 | 9/2013 | Sutardja |
| 8,558,395 B2 | 10/2013 | Khan et al. |
| 8,648,469 B2 | 2/2014 | Choi et al. |
| 8,686,558 B2 | 4/2014 | Zhao et al. |
| 8,836,115 B1 | 9/2014 | St. Amand et al. |
| 8,971,053 B2 | 3/2015 | Kariya et al. |
| 9,048,306 B2 | 6/2015 | Chi et al. |
| 9,196,575 B1 * | 11/2015 | Lee ..................... H01L 23/3675 |
| 9,252,032 B2 | 2/2016 | Choi et al. |

(56) References Cited

U.S. PATENT DOCUMENTS

| | | |
|---|---|---|
| 9,252,130 B2 | 2/2016 | Kim et al. |
| 9,263,332 B2 | 2/2016 | Chi et al. |
| 9,281,300 B2 | 3/2016 | Merilo et al. |
| 9,305,897 B2 | 4/2016 | Choi et al. |
| 9,337,161 B2 | 5/2016 | Camacho et al. |
| 9,379,078 B2 | 6/2016 | Yu et al. |
| 9,385,095 B2 | 7/2016 | Jeng et al. |
| 2011/0024888 A1* | 2/2011 | Pagaila .................. H01L 23/13 257/686 |
| 2013/0052775 A1* | 2/2013 | Kim ...................... H01L 23/552 438/118 |
| 2014/0210107 A1 | 7/2014 | Zhai |

\* cited by examiner

THERMALLY ENHANCED SEMICONDUCTOR ASSEMBLY WITH THREE DIMENSIONAL INTEGRATION AND METHOD OF MAKING THE SAME

CROSS REFERENCE TO RELATED APPLICATIONS

This application is a continuation-in-part of U.S. application Ser. No. 15/166,185 filed May 26, 2016, a continuation-in-part of U.S. application Ser. No. 15/289,126 filed Oct. 8, 2016, a continuation-in-part of U.S. application Ser. No. 15/353,537 filed Nov. 16, 2016, a continuation-in-part of U.S. application Ser. No. 15/415,844 filed Jan. 25, 2017, a continuation-in-part of U.S. application Ser. No. 15/415,846 filed Jan. 25, 2017 and a continuation-in-part of U.S. application Ser. No. 15/462,536 filed Mar. 17, 2017. The U.S. application Ser. No. 15/166,185 claims the priority benefit of U.S. Provisional Application Ser. No. 62/166,771 filed May 27, 2015. The U.S. application Ser. No. 15/289,126 is a continuation-in-part of U.S. application Ser. No. 15/166,185 filed May 26, 2016. The U.S. application Ser. No. 15/353,537 is a continuation-in-part of U.S. application Ser. No. 15/166,185 filed May 26, 2016 and a continuation-in-part of U.S. application Ser. No. 15/289,126 filed Oct. 8, 2016. The U.S. application Ser. Nos. 15/415,844, 15/415,846 and 15/462,536 are continuation-in-part of U.S. application Ser. No. 15/166,185 filed May 26, 2016, continuation-in-part of U.S. application Ser. No. 15/289,126 filed Oct. 8, 2016 and continuation-in-part of U.S. application Ser. No. 15/353,537 filed Nov. 16, 2016. The entirety of each of said applications is incorporated herein by reference.

FIELD OF THE INVENTION

The present invention relates to a semiconductor assembly and, more particularly, to a thermally enhanced semiconductor assembly with three dimensional integration in which a stacked semiconductor sub-assembly is wire bonded to and thermally conductible to a wiring board having a heat spreader integrated with dual wiring structures, and a method of making the same.

DESCRIPTION OF RELATED ART

Market trends of multimedia devices demand for faster and slimmer designs. One of assembly approaches is to interconnect two devices with stacking configuration so that the routing distance between the two devices can be the shortest possible. As the stacked devices can talk directly to each other with reduced latency, the assembly's signal integrity and additional power saving capability are greatly improved. However, as semiconductor devices are susceptible to performance degradation at high operational temperatures, stacking chips without proper heat dissipation would worsen devices' thermal environment and may cause immediate failure during operation.

Additionally, U.S. Pat. Nos. 8,008,121, 8,519,537 and 8,558,395 disclose various assembly structures having an interposer disposed in between the face-to-face chips. Although there is no TSV in the stacked chips, the TSV in the interposer that serves for circuitry routing between chips induces complicated manufacturing processes, high yield loss and excessive cost.

For the reasons stated above, and for other reasons stated below, an urgent need exists to provide a three dimensional semiconductor assembly that can address high packaging density, better signal integrity and high thermal dissipation requirements.

SUMMARY OF THE INVENTION

The objective of the present invention is to provide a thermally enhanced semiconductor assembly in which a stacked semiconductor sub-assembly is electrically connected to a wiring board through a plurality of bonding wires and thermal conductible to a heat spreader provided in the wiring board. The heat spreader is disposed in a through opening of a wiring structure and mechanically supported by, electrically connected with, and thermally dissipated through another wiring structure, thereby improving mechanical, thermal and electrical performances of the assembly.

In accordance with the foregoing and other objectives, the present invention provides a thermally enhanced semiconductor assembly having a stacked semiconductor sub-assembly electrically connected to a wiring board through bonding wires. The stacked semiconductor sub-assembly includes a first device, a second device and a routing circuitry. The wiring board includes a heat spreader, a first wiring structure and a second wiring structure. In a preferred embodiment, the first device is thermally conductible to the heat spreader and spaced from and electrically connected to the second device through the routing circuitry; the routing circuitry provides primary fan-out routing and the shortest interconnection distance between the first device and the second device; the first wiring structure laterally surrounds peripheral edges of the heat spreader and the sub-assembly, and is electrically coupled to the routing circuitry by bonding wires to provide further fan-out routing; and the second wiring structure covers the first wiring structure and the heat spreader to provide mechanically support, and is thermally conductible to the heat spreader and electrically coupled to the first wiring structure.

Accordingly, the present invention provides a thermally enhanced semiconductor assembly with three dimensional integration, comprising: a stacked semiconductor sub-assembly that includes a first device, a second device and a routing circuitry, wherein the first device is electrically coupled to a first surface of the routing circuitry and the second device is electrically coupled to a second surface of the routing circuitry opposite to the first surface; a wiring board that includes a first wiring structure, a second wiring structure and a heat spreader, wherein (i) the first wiring structure has a first surface, an opposite second surface, and a through opening extending from the first surface and to the second surface, (ii) the heat spreader is disposed in the through opening and has a backside surface substantially coplanar with the first surface of the first wiring structure, (iii) the second wiring structure is disposed on the backside surface of the heat spreader and the first surface of the first wiring structure and electrically connected to the first wiring structure and thermally conductible to the heat spreader through metallized vias, and (iv) the stacked semiconductor sub-assembly is disposed in the through opening; and a plurality of bonding wires that electrically couple the routing circuitry to the wiring board.

Additionally, the present invention provides a method of making a thermally enhanced semiconductor assembly with three dimensional integration, comprising: providing a stacked semiconductor sub-assembly that includes a first device, a second device and a routing circuitry, wherein the first device is electrically coupled to a first surface of the routing circuitry and the second device is electrically coupled to a second surface of the routing circuitry opposite to the first surface; providing a wiring board that includes a first wiring structure, a second wiring structure and a heat spreader, wherein (i) the first wiring structure has a first surface, an opposite second surface, and a through opening extending from the first surface to the second surface, (ii) the heat spreader is disposed in the through opening and has a backside surface substantially coplanar with the first surface of the first wiring structure, and (iii) the second wiring structure is disposed on the backside surface of the heat spreader and the first surface of the first wiring structure and electrically connected to the first wiring structure and thermally conductible to the heat spreader through metallized vias; disposing the stacked semiconductor sub-assembly in the through opening of the first wiring structure and over the heat spreader; and providing a plurality of bonding wires that electrically couple the routing circuitry and the wiring board.

Unless specifically indicated or using the term "then" between steps, or steps necessarily occurring in a certain order, the sequence of the above-mentioned steps is not limited to that set forth above and may be changed or reordered according to desired design.

The semiconductor assembly and the method of making the same according to the present invention have numerous advantages. For instance, stacking and electrically coupling the first and second devices to both opposite sides of the routing circuitry can offer the shortest interconnect distance between the first and second devices. Inserting the sub-assembly into the through opening of the first wiring structure of the wiring board is particularly advantageous as the wiring board can provide mechanical housing for the sub-assembly, whereas the heat spreader in the through opening and mechanically supported by the second wiring structure can provide thermal dissipation for the first device. Additionally, attaching the bonding wires to the sub-assembly and the wiring board can offer a reliable connecting channel for interconnecting the devices assembled in the sub-assembly to terminal pads provided in the wiring board.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Figure 1:
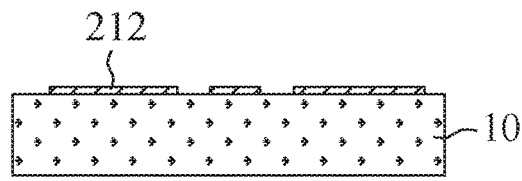
FIG. 1 is a cross-sectional view of a structure with routing traces formed on a sacrificial carrier in accordance with the first embodiment of the present invention.

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-12 are schematic views showing a method of making a semiconductor assembly that includes a routing circuitry 21, a first device 22, a molding compound 25, a second device 27, a wiring board 30 and bonding wires 41 in accordance with the first embodiment of the present invention.

FIG. 1 is a cross-sectional view of the structure with routing traces 212 formed on a sacrificial carrier 10. The sacrificial carrier 10 typically is made of copper, aluminum, iron, nickel, tin, stainless steel, silicon, or other metals or alloys, but any other conductive or non-conductive material also may be used. In this embodiment, the sacrificial carrier 10 is made of an iron-based material. The routing traces 212 typically are made of copper and can be pattern deposited by numerous techniques, such as electroplating, electroless plating, evaporating, sputtering or their combinations, or be thin-film deposited followed by a metal patterning process. For a conductive sacrificial carrier 10, the routing traces 212 are deposited typically by plating of metal. The metal patterning techniques include wet etching, electro-chemical etching, laser-assist etching, and their combinations with an etch mask (not shown) thereon that defines the routing traces 212.

Figure 2:
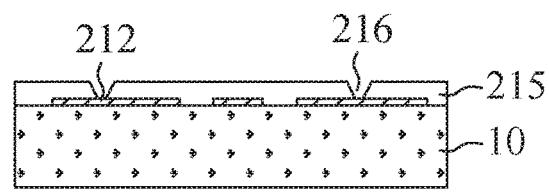
FIG. 2 is a cross-sectional view of the structure of FIG. 1 further provided with a dielectric layer and via openings in accordance with the first embodiment of the present invention.

FIG. 2 is a cross-sectional view of the structure with a dielectric layer 215 on the sacrificial carrier 10 as well as the routing traces 212 and via openings 216 in the dielectric layer 215. The dielectric layer 215 is deposited typically by lamination or coating, and contacts and covers and extends laterally on the sacrificial carrier 10 and the routing traces 212 from above. The dielectric layer 215 typically has a thickness of 50 microns, and can be made of epoxy resin, glass-epoxy, polyimide, or the like. After the deposition of the dielectric layer 215, the via openings 216 are formed by numerous techniques, such as laser drilling, plasma etching and photolithography, and typically have a diameter of 50 microns. Laser drilling can be enhanced by a pulsed laser. Alternatively, a scanning laser beam with a metal mask can be used. The via openings 216 extend through the dielectric layer 215 and are aligned with selected portions of the routing traces 212.

Figure 3:
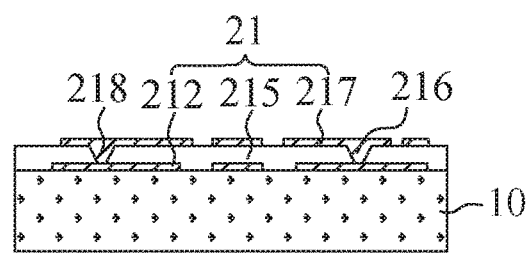
FIG. 3 is a cross-sectional view of the structure of FIG. 2 further provided with conductive traces in accordance with the first embodiment of the present invention.

Referring now to FIG. 3, conductive traces 217 are formed on the dielectric layer 215 by metal deposition and metal patterning process. The conductive traces 217 extend from the routing traces 212 in the upward direction, fill up the via openings 216 to form metallized vias 218 in direct contact with the routing traces 212, and extend laterally on the dielectric layer 215. As a result, the conductive traces 217 can provide horizontal signal routing in both the X and Y directions and vertical routing through the via openings 216 and serve as electrical connections for the routing traces 212.

The conductive traces 217 can be deposited as a single layer or multiple layers by any of numerous techniques, such as electroplating, electroless plating, evaporating, sputtering, or their combinations. For instance, they can be deposited by first dipping the structure in an activator solution to render the dielectric layer 215 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the conductive traces 217 by any of numerous techniques such as wet etching, electro-chemical etching, laser-assist etching, or their combinations, with an etch mask (not shown) thereon that defines the conductive traces 217.

At this stage, the formation of a routing circuitry 21 on the sacrificial carrier 10 is accomplished. In this illustration, the routing circuitry 21 is a multi-layered buildup circuitry and includes routing traces 212, a dielectric layer 215 and conductive traces 217.

Figure 4:
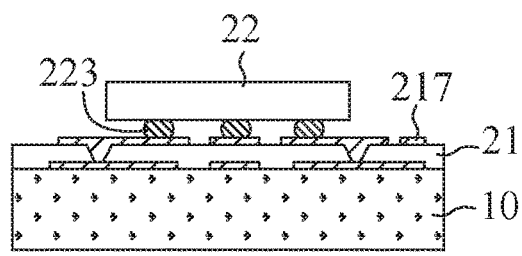
FIG. 4 is a cross-sectional view of the structure of FIG. 3 further provided with a first device in accordance with the first embodiment of the present invention.

FIG. 4 is a cross-sectional view of the structure with a first device 22 electrically coupled to the routing circuitry 21. The first device 22 can be electrically coupled to the conductive traces 217 of the routing circuitry 21 using first bumps 223 in contact with the first device 22 and the first routing circuitry 21 by thermal compression, solder reflow or thermosonic bonding. In this example, the first device 22 is illustrated as a semiconductor chip.

Figure 5:
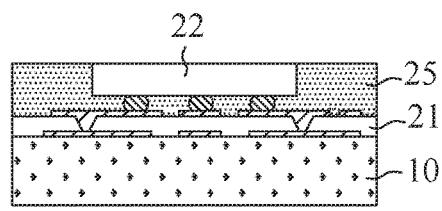
FIG. 5 is a cross-sectional view of the structure of FIG. 4 further provided with a molding compound in accordance with the first embodiment of the present invention.

FIG. 5 is a cross-sectional view of the structure with a molding compound 25 on the routing circuitry 21 and around the first device 22 by, for example, resin-glass lamination, resin-glass coating or molding. The molding compound 25 covers the routing circuitry 21 from above and surrounds and conformally coats and covers sidewalls of the first device 22. As an alternative, the step of providing the molding compound 25 may be omitted.

Figure 6:
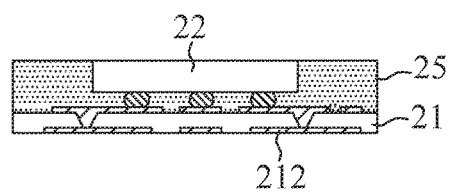
FIG. 6 is a cross-sectional view of the structure of FIG. 5 after removal of the sacrificial carrier in accordance with the first embodiment of the present invention.

FIG. 6 is a cross-sectional view of the structure after removal of the sacrificial carrier 10. The sacrificial carrier 10 can be removed to expose the routing circuitry 21 from below by numerous techniques, such as wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 10 made of an iron-based material is removed by a chemical etching solution that is selective between copper and iron so as to prevent the copper routing traces 212 from being etched during removal of the sacrificial carrier 10.

Figure 7:
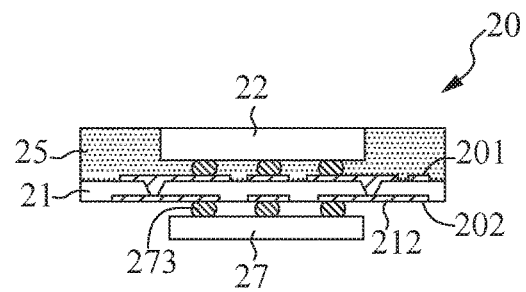
FIG. 7 is a cross-sectional view of the structure of FIG. 6 further provided with a second device to finish the fabrication of a stacked semiconductor sub-assembly in accordance with the first embodiment of the present invention.

FIG. 7 is a cross-sectional view of the structure with a second device 27 electrically coupled to the routing circuitry 21. The second device 27 can be electrically coupled to the routing traces 212 of the routing circuitry 21 using second bumps 273 in contact with the second device 27 and the routing circuitry 21 by thermal compression, solder reflow or thermosonic bonding. In this example, the second device 27 is illustrated as a semiconductor chip. However, in some cases, the second device 27 may be a packaged device or a passive component.

At this stage, a stacked semiconductor sub-assembly 20 is accomplished and includes a routing circuitry 21, a first device 22, a molding compound 25, and a second device 27. The first device 22 and the second device 27 are electrically coupled to first and second surfaces 201, 202 of the routing circuitry 21, respectively, and the molding compound 25 is disposed over the first surface 201 and laterally surrounds the first device 22.

Figure 8:
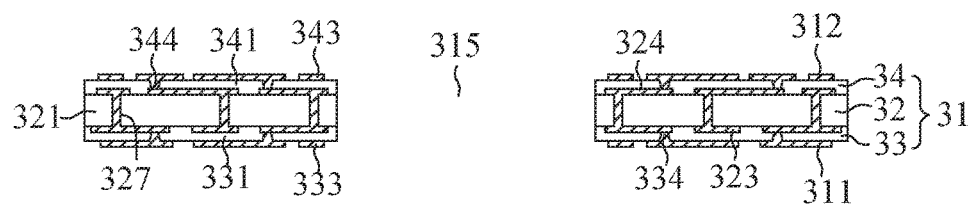
FIG. 8 is a cross-sectional view of a first wiring structure in accordance with the first embodiment of the present invention.

FIG. 8 is a cross-sectional view of a first wiring structure 31. The first wiring structure 31 has a through opening 315 extending from its first surface 311 to its second surface 312. In this illustration, the first wiring structure 31 includes an interconnect substrate 32, a first buildup circuitry 33 and a second buildup circuitry 34. The interconnect substrate 32 includes a core layer 321, a first routing layer 323, a second routing layer 324 and metallized through vias 327. The first routing layer 323 and the second routing layer 324 respectively extend laterally on both sides of the core layer 321, and metallized through vias 327 extend through the core layer 321 to provide electrical connections between the first routing layer 323 and the second routing layer 324. The first buildup circuitry 33 and the second buildup circuitry 34 are respectively disposed on both sides of the interconnect substrate 32, and each of them includes a dielectric layer 331, 341 and conductive traces 333, 343. The dielectric layers 331, 341 respectively cover both sides of the interconnect substrate 32 from below and above, and can be made of epoxy resin, glass-epoxy, polyimide, or the like. The conductive traces 333, 343 respectively extend laterally on the dielectric layers 331, 341, and include metallized vias 334, 344 in the dielectric layers 331, 341. The metallized vias 334, 344 contact the first and second routing layers 323, 324 of the interconnect substrate 32, and extend through the dielectric layers 331, 341.

Figure 9:
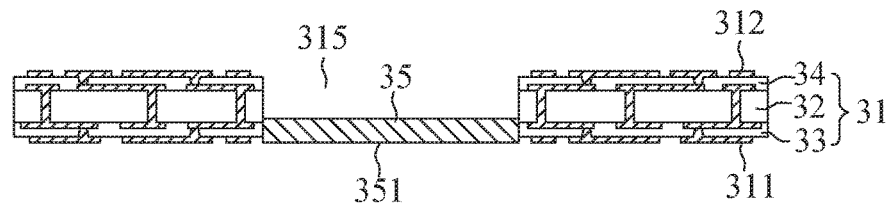
FIG. 9 is a cross-sectional view of the structure of FIG. 8 further provided with a heat spreader in accordance with the first embodiment of the present invention.

FIG. 9 is a cross-sectional view of the structure with a heat spreader 35 disposed in the through opening 315 of the first wiring structure 31. The heat spreader 35 can be a thermally conductive layer made of, for example, metal, alloy, silicon, ceramic or graphite. In this embodiment, the heat spreader 35 is a metal layer and has a backside surface 351 substantially coplanar with the first surface 311 of the first wiring structure 31 from below.

Figure 10:
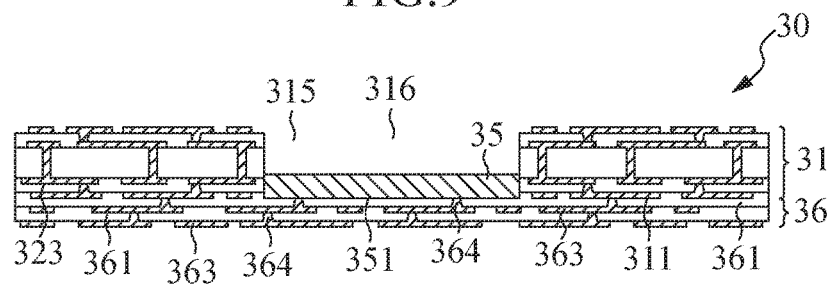
FIG. 10 is a cross-sectional view of the structure of FIG. 9 further provided with a second wiring structure to finish the fabrication of a wiring board in accordance with the first embodiment of the present invention.

FIG. 10 is a cross-sectional view of the structure with a second wiring structure 36 formed on the backside surface 351 and the first surface 311 of the first wiring structure 31. In this illustration, the second wiring structure 36 is a multi-layered buildup circuitry without a core layer, and includes multiple dielectric layers 361 and conductive traces 363 in an alternate fashion. The conductive traces 363 extend laterally on the dielectric layers 361 and include metallized vias 364 in the dielectric layers 361. Accordingly, the second wiring structure 36 can be electrically coupled to the first wiring structure 31 and the heat spreader 35 through the metallized vias 364 embedded in the dielectric layers 361 and in contact with the first routing layer 323 and the heat spreader 35.

At this stage, a wiring board 30 is accomplished and includes a first wiring structure 31, a heat spreader 35 and a second wiring structure 36. As the depth of the through opening 315 is more than the thickness of the heat spreader 35, the exterior surface of the heat spreader 35 and the sidewall surface of the through opening 315 of the first wiring structure 31 forms a cavity 316 in the through opening 315 of the first wiring structure 31. As a result, the heat spreader 35 can provide thermal dissipation for a device accommodated in the cavity 316, whereas the combination of the first wiring structure 31 and the second wiring structure 36 offers electrical contacts for next connection from two opposite sides of the wiring board 30.

Figure 11:
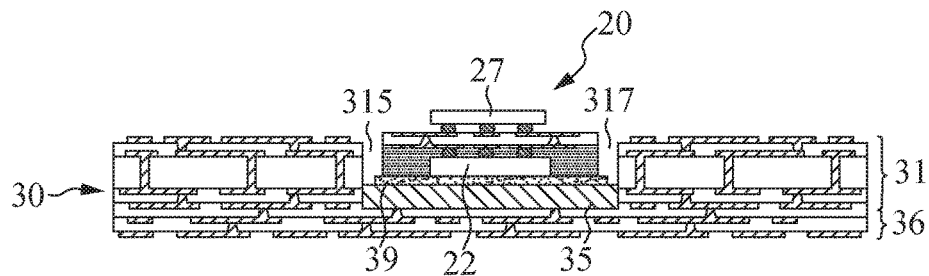
FIG. 11 is a cross-sectional view of the structure of FIG. 10 further provided with the stacked semiconductor sub-assembly of FIG. 7 in accordance with the first embodiment of the present invention.

FIG. 11 is a cross-sectional view of the structure with the stacked semiconductor sub-assembly 20 of FIG. 7 attached to the wiring board 30 of FIG. 10. The stacked semiconductor sub-assembly 20 is aligned with and disposed in the through opening 315 of the first wiring structure 31, with the first device 22 attached to the heat spreader 35 of the wiring board 30 using a thermally conductive material 39. The thermally conductive material 39 can be a solder (e.g., AuSn) or a silver/epoxy adhesive. The interior sidewalls of the through opening 315 laterally surround and are spaced from peripheral edges of the stacked semiconductor sub-assembly 20. As a result, a gap 317 is left in the through opening 315 between the peripheral edges of the stacked semiconductor sub-assembly 20 and the interior sidewalls of the first wiring structure 31. The gap 317 laterally surrounds the stacked semiconductor sub-assembly 20 and is laterally surrounded by the first wiring structure 31.

Figure 12:
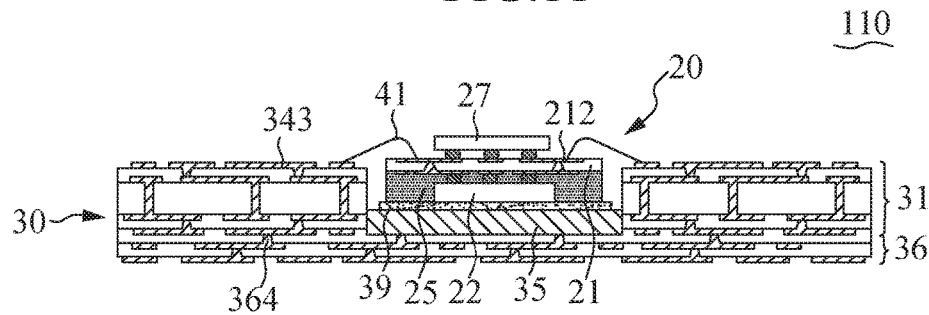
FIG. 12 is a cross-sectional view of the structure of FIG. 11 further provided with bonding wires to finish the fabrication of a semiconductor assembly in accordance with the first embodiment of the present invention.

FIG. 12 is a cross-sectional view of the structure with bonding wires 41 attached to the stacked semiconductor sub-assembly 20 and the wiring board 30 typically by gold or copper ball bonding, or gold or aluminum wedge bonding. The bonding wires 41 contact and are electrically coupled to the routing traces 212 of the routing circuitry 21 and the conductive traces 343 of the first wiring structure 31. As a result, the bonding wires 41 can electrically couple the routing circuitry 21 to the first wiring structure 31.

Accordingly, as shown in FIG. 12, a semiconductor assembly 110 is accomplished and includes a stacked semiconductor sub-assembly 20 electrically connected to a wiring board 30 by bonding wires 41. In this illustration, the stacked semiconductor sub-assembly 20 includes a routing circuitry 21, a first device 22, a molding compound 25 and a second device 27, whereas the wiring board 30 includes a first wiring structure 31, a heat spreader 35 and a second wiring structure 36.

The first device 22 is flip-chip electrically coupled to the routing circuitry 21 from one side of the routing circuitry 21 and enclosed by the molding compound 25 and the heat spreader 35. The second device 27 is flip-chip electrically coupled to the routing circuitry 21 from the other side of the routing circuitry 21 and face-to-face connected to the first device 22 through the routing circuitry 21. As such, the routing circuitry 21 offers primary fan-out routing and the shortest interconnection distance between the first device 22 and the second device 27. The heat spreader 35 of the wiring board 30 is thermally conductible to and covers the first device 22 from below. The first wiring structure 31 laterally surrounds peripheral edges of the stacked semiconductor sub-assembly 20 and the heat spreader 35, and is electrically coupled to the routing circuitry 21 by the bonding wires 41. The second wiring structure 36 covers the first wiring structure 31 and the heat spreader 35 from below, and is electrically coupled to the first wiring structure 31 and thermally conductible to the heat spreader 35 through metallized vias 364. As a result, the routing circuitry 21, the first wiring structure 31 and the second wiring structure 36 can provide staged fan-out routing for the first device 22 and the second device 27.

Figure 13:
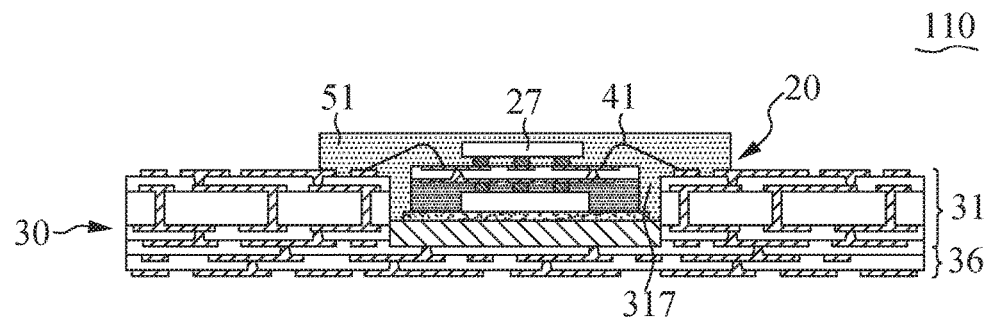
FIG. 13 is a cross-sectional view of the structure of FIG. 12 further provided with an encapsulant in accordance with the first embodiment of the present invention.

FIG. 13 is a cross-sectional view of the semiconductor assembly 110 of FIG. 12 further provided with an encapsulant 51. The encapsulant 51 covers the bonding wires 41 and the stacked semiconductor sub-assembly 20 as well as selected portions of the wiring board 30 from above, and further fills up the gap 317 between the peripheral edges of the stacked semiconductor sub-assembly 20 and the interior sidewalls of the wiring board 30.

Figure 14:
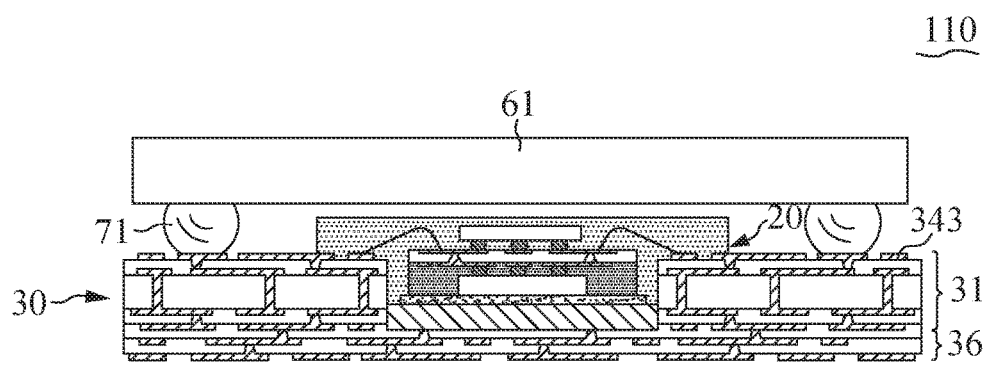
FIG. 14 is a cross-sectional view of the structure of FIG. 13 further provided with a third device in accordance with the first embodiment of the present invention.

FIG. 14 is a cross-sectional view of the semiconductor assembly 110 of FIG. 13 further provided with a third device 61 stacked over the stacked semiconductor sub-assembly 20 and the first wiring structure 31 of the wiring board 30. The third device 61 can be a ball grid array package or a bumped chip, and is electrically coupled to the conductive traces 343 of the first wiring structure 31 through solder balls 71.

Figure 15:
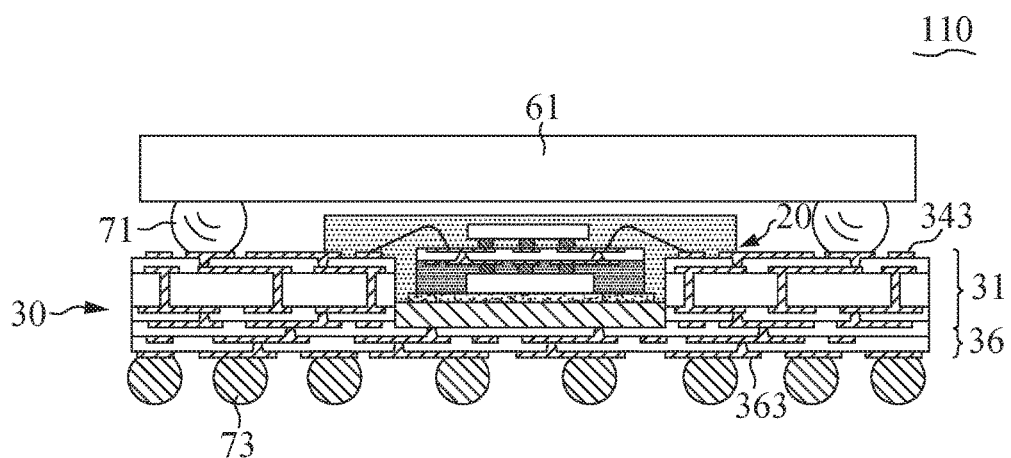
FIG. 15 is a cross-sectional view of the structure of FIG. 14 further provided with solder balls in accordance with the first embodiment of the present invention.

FIG. 15 is a cross-sectional view of the semiconductor assembly 110 of FIG. 14 further provided with solder balls 73. The solder balls 73 are mounted on the second wiring structure 36 of the wiring board 30 for external connection.

Figure 16:
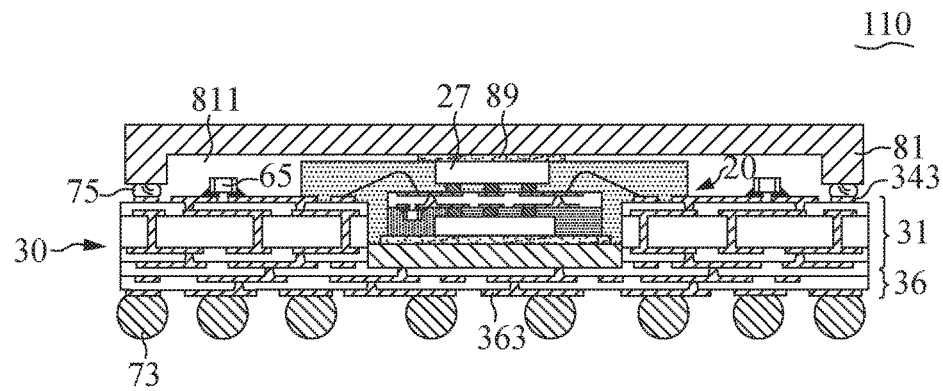
FIG. 16 is a cross-sectional view of the structure of FIG. 13 further provided with passive components, an additional heat spreader and solder balls in accordance with the first embodiment of the present invention.

FIG. 16 is a cross-sectional view of the semiconductor assembly 110 of FIG. 13 further provided with passive components 65 and a heat spreader 81 at the first wiring structure 31 and solder balls 73 at the second wiring structure 36. The passive components 65 are electrically coupled to the conductive traces 343 of the first wiring structure 31. The heat spreader 81 has a cavity 811 and is mounted on the first wiring structure 31 and electrically coupled to the conductive traces 343 of the first wiring structure 31 for ground connection by solder balls 75. The second device 27 is accommodated in the cavity 811 of the heat spreader 81 and thermally conductible to the heat spreader 81 by a thermally conductive material 89 in contact with the second device 27 and the heat spreader 81. The solder balls 73 are mounted on the conductive traces 363 of the second wiring structure 36 for external connection.

Figure 17:
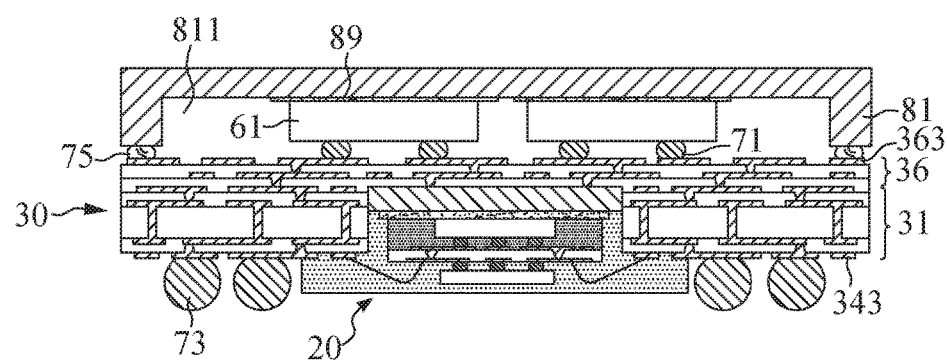
FIG. 17 is a cross-sectional view of the inverted structure of FIG. 13 further provided with third devices, an additional heat spreader and solder balls in accordance with the first embodiment of the present invention.

FIG. 17 is a cross-sectional view of the inverted semiconductor assembly 110 of FIG. 13 further provided with third devices 61 and a heat spreader 81 at the second wiring structure 36 and solder balls 73 at the first wiring structure 31. The third devices 61 can be ball grid array packages or bumped chips accommodated in a cavity 811 of the heat spreader 81, and are electrically coupled to the conductive traces 363 of the second wiring structure 36 by solder balls 71. The heat spreader 81 is thermally conductive to the third devices 61 using a thermally conductive material 89, and electrically coupled to the conductive traces 363 of the second wiring structure 36 by solder balls 75. The solder balls 73 are mounted on the conductive traces 343 of the first wiring structure 31 for external connection.

Figure 18:
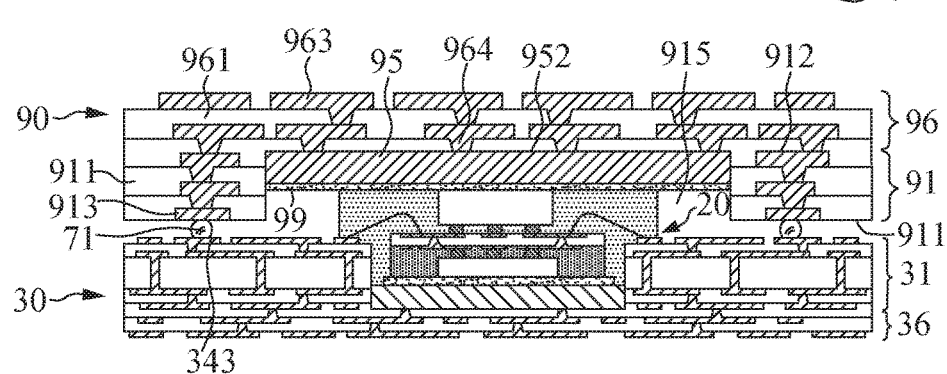
FIG. 18 is a cross-sectional view of the structure of FIG. 13 further provided with an additional wiring board in accordance with the first embodiment of the present invention.

FIG. 18 is a cross-sectional view of the semiconductor assembly 110 of FIG. 13 further provided with an additional wiring board 90. The wiring board 90 is stacked over the stacked semiconductor sub-assembly 20 and the wiring board 30, and includes a third wiring structure 91, a heat spreader 95 and a fourth wiring structure 96. In this illustration, both the third wiring structure 91 and the fourth wiring structure 96 are multi-layered buildup circuitries without a core layer, and each includes multiple dielectric layers 911, 961 and conductive traces 913, 963 in an alternate fashion to provide electrical contacts at two opposite sides of the wiring board 90. The third wiring structure 91 has a through opening 915 extending from its first surface 911 to its second surface 912, and is electrically coupled to the conductive traces 343 of the first wiring structure 31 by solder balls 71. The heat spreader 95 is disposed in the through opening 915 of the third wiring structure 91, and has a backside surface 952 substantially coplanar with the second surface 912 of the third wiring structure 91. The second device 27 is attached to and thermally conductible to the heat spreader 95 by a thermally conductive material 99 and laterally surrounded by the third wiring structure 91. The fourth wiring structure 96 is disposed on the second surface 912 of the third wiring structure 91 and the backside surface 952 of the heat spreader 95, and includes metallized vias 964 embedded in the dielectric layer 961 and in contact with the conductive traces 913 of the third wiring structure 91 and the heat spreader 95.

Figure 19:
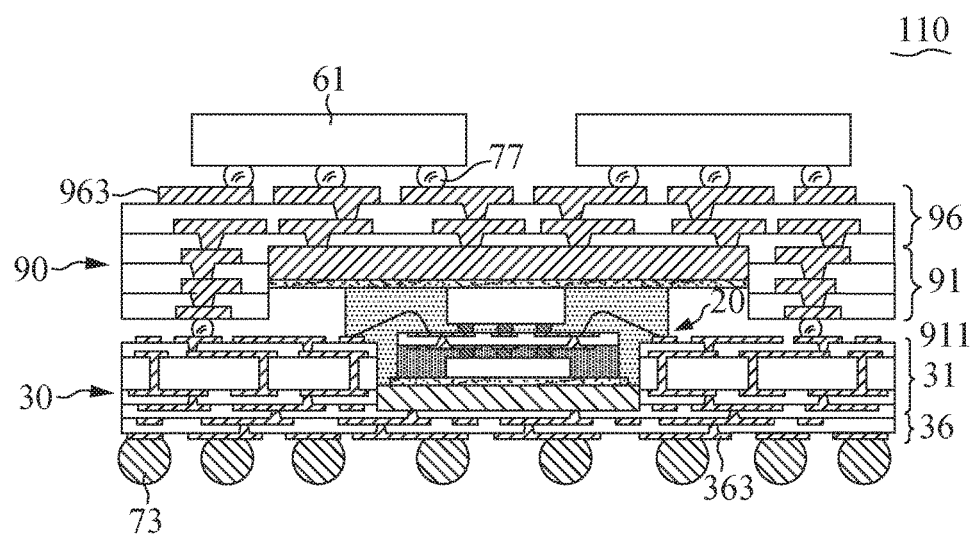
FIG. 19 is a cross-sectional view of the structure of FIG. 18 further provided with third devices and solder balls in accordance with the first embodiment of the present invention.

FIG. 19 is a cross-sectional view of the semiconductor assembly 110 of FIG. 18 further provided with third devices 61 at the fourth wiring structure 96 and solder balls 73 at the second wiring structure 36. The third devices 61 can be ball grid array packages or a bumped chips, and are stacked over and electrically coupled to the conductive traces 963 of the fourth wiring structure 96 through solder balls 77. The solder balls 73 are mounted on the conductive traces 363 of the second wiring structure 36 for external connection.

Figure 20:
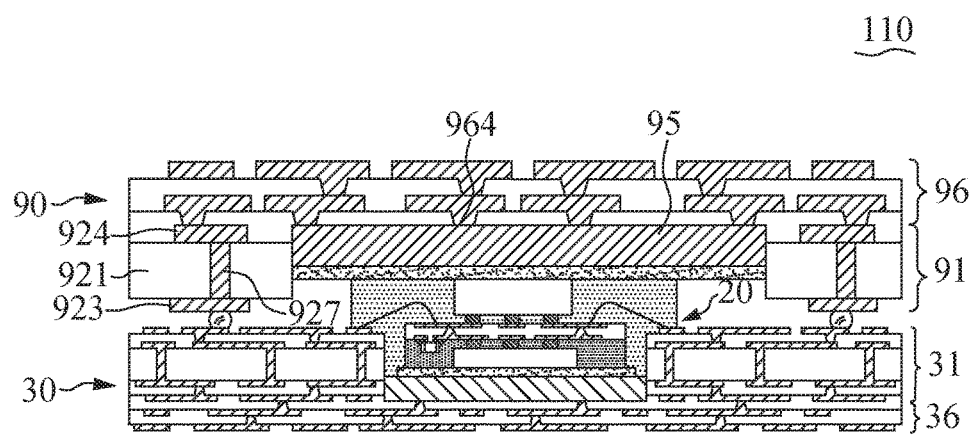
FIG. 20 is a cross-sectional view of the structure of FIG. 13 further provided with another aspect of the additional wiring board in accordance with the first embodiment of the present invention.

FIG. 20 is a cross-sectional view of the semiconductor assembly 110 of FIG. 13 further provided with another aspect of the additional wiring board 90. The wiring board 90 is similar to that illustrated in FIG. 18, except that the third wiring structure 91 is an interconnect substrate that includes a core layer 921, a first routing layer 923, a second routing layer 924, and metallized through vias 927. The first routing layer 923 and the second routing layer 924 are disposed on opposite sides of the core layer 921. The metallized through vias 927 extend through the core layer 921 and are electrically coupled to the first routing layer 923 and the second routing layer 924. The fourth wiring structure 96 includes metallized vias 964 in contact with the second routing layer 924 of the third wiring structure 91 and the heat spreader 95.

Embodiment 2

FIGS. 21-24 are schematic views showing a method of making a semiconductor assembly with the stacked semiconductor sub-assembly laterally surrounded by metallized sidewalls of the cavity of the wiring board in accordance with the second embodiment of the present invention.

For purposes of brevity, any description in Embodiment 1 above is incorporated herein insofar as the same is applicable, and the same description need not be repeated.

Figure 21:
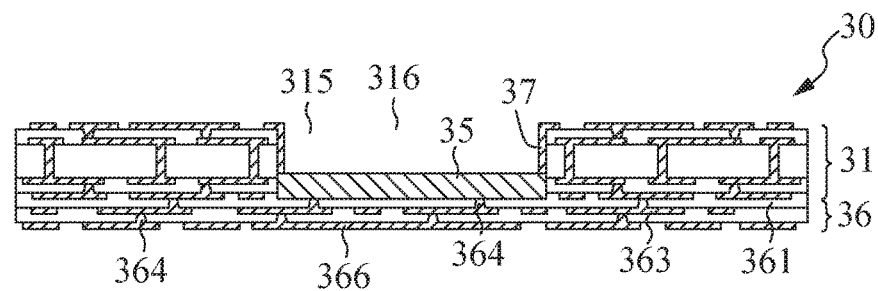
FIG. 21 is a cross-sectional view of a wiring board in accordance with the second embodiment of the present invention.

FIG. 21 is a cross-sectional view of a wiring board 30. The wiring board 30 is similar to that illustrated in FIG. 10, except that (i) it further includes a metal layer 37 that completely covers sidewalls of the through opening 315 of the first wiring structure 31 and contacts the heat spreader 35, and (ii) the outmost conductive traces 363 of the second wiring structure 36 includes a thermal pad 366. In this illustration, the exterior surface of the heat spreader 35 and the lateral surface of the metal layer 37 forms a cavity 316 in the through opening 315 of the first wiring structure 31.

Figure 22:
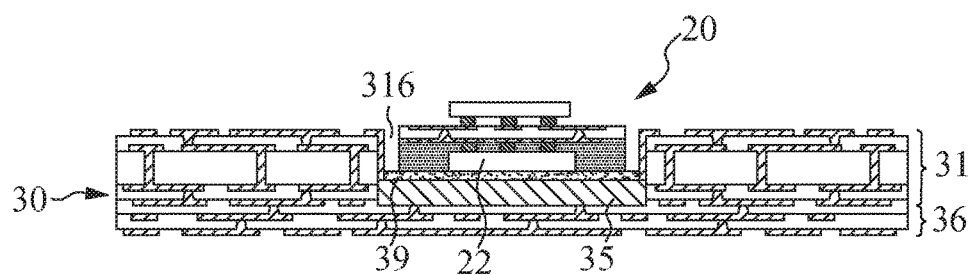
FIG. 22 is a cross-sectional view of the structure of FIG. 21 further provided with the stacked semiconductor sub-assembly of FIG. 7 in accordance with the second embodiment of the present invention.

FIG. 22 is a cross-sectional view of the structure with the stacked semiconductor sub-assembly 20 of FIG. 7 attached to the wiring board 30 of FIG. 21. The stacked semiconductor sub-assembly 20 is disposed in the cavity 316 of the wiring board 30 and attached to the heat spreader 35 using a thermally conductive material 39.

Figure 23:
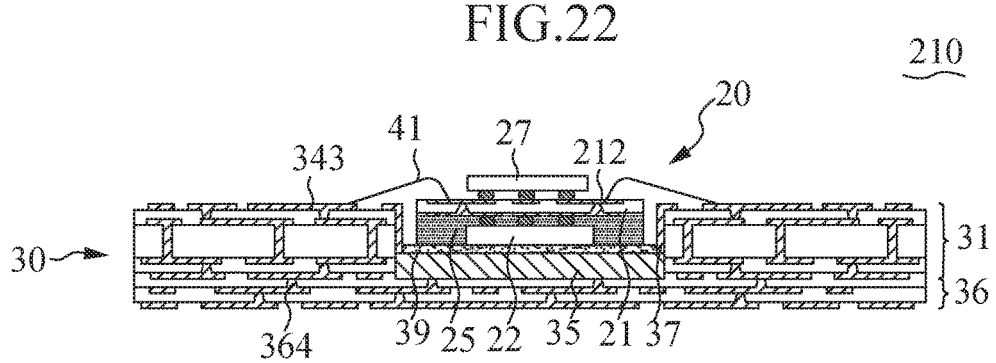
FIG. 23 is a cross-sectional view of the structure of FIG. 22 further provided with bonding wires to finish the fabrication of a semiconductor assembly in accordance with the second embodiment of the present invention.

FIG. 23 is a cross-sectional view of the structure with bonding wires 41 attached to the stacked semiconductor sub-assembly 20 and the wiring board 30. The bonding wires 41 contact and are electrically coupled to the routing traces 212 of the routing circuitry 21 and the conductive traces 343 of the first wiring structure 31.

Accordingly, as shown in FIG. 23, a semiconductor assembly 210 is accomplished and includes a stacked semiconductor sub-assembly 20 electrically connected to a wiring board 30 by bonding wires 41. In this illustration, the stacked semiconductor sub-assembly 20 includes a routing circuitry 21, a first device 22, a molding compound 25 and a second device 27, whereas the wiring board 30 includes a first wiring structure 31, a heat spreader 35, a second wiring structure 36 and a metal layer 37.

The first device 22 and the second device 27 are disposed at two opposite sides of the routing circuitry 21 and face-to-face electrically connected to each other through the routing circuitry 21 therebetween. As such, the routing circuitry 21 offers the shortest interconnection distance between the first device 22 and the second device 27, and provides first level fan-out routing for the first device 22 and the second device 27. The heat spreader 35 covers the inactive surface of the first device 22 and is thermally conductible to the first device 22, whereas the metal layer 37 surrounds peripheral edges of the stacked semiconductor sub-assembly 20 and contacts the heat spreader 35. The first wiring structure 31 is electrically coupled to the routing circuitry 21 through bonding wires 41. The second wiring structure 36 covers the first wiring structure 31 and the heat spreader 35 from below, and is electrically coupled to the first wiring structure 31 for signal routing and to the heat spreader 35 for ground connection through metallized vias 364. Accordingly, the combination of the first wiring structure 31 and the second wiring structure 36 can provide second level fan-out routing for the routing circuitry 21 and electrical contacts for next-level connection, whereas the combination of the heat spreader 35 and the metal layer 37, electrically connected to the second wiring structure 36, provides thermal dissipation and EMI shielding for the first device 22.

Figure 24:
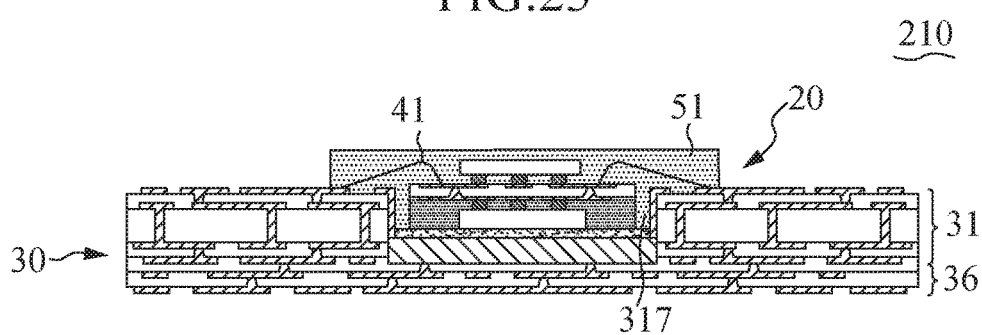
FIG. 24 is a cross-sectional view of the structure of FIG. 23 further provided with an encapsulant in accordance with the second embodiment of the present invention.

FIG. 24 is a cross-sectional view of the semiconductor assembly 210 of FIG. 23 further provided with an encapsulant 51. The encapsulant covers the bonding wires 41, the stacked semiconductor sub-assembly 20 as well as selected portions of the first wiring structure 31 from above, and further fills up a gap 317 between the peripheral edges of the stacked semiconductor sub-assembly 20 and the interior sidewalls of the wiring board 30.

Figure 25:
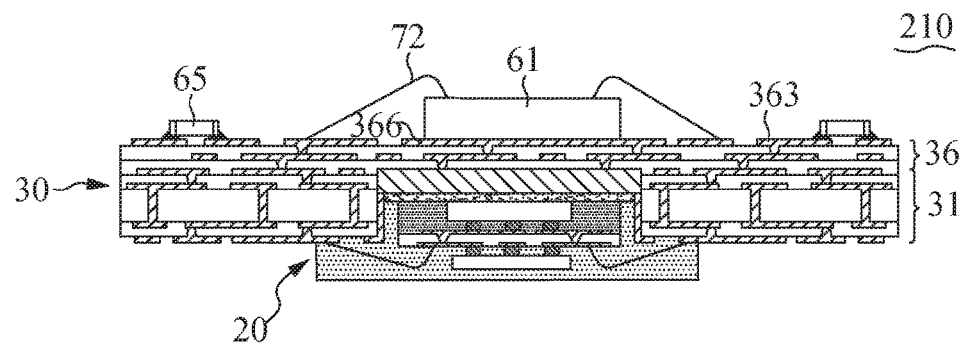
FIG. 25 is a cross-sectional view of the inverted structure of FIG. 24 further provided with a third device and passive components in accordance with the second embodiment of the present invention.

FIG. 25 is a cross-sectional view of the inverted semiconductor assembly 210 of FIG. 24 further provided with a third device 61 and passive components 65. The third device 61 is illustrated as a semiconductor chip, and is attached on the thermal pad 366 of the second wiring structure 36 and electrically coupled to the conductive traces 363 of the second wiring structure 36 by bonding wires 72. The passive components 65 are mounted on and electrically coupled to the conductive traces 363 of the second wiring structure 36.

Figure 26:
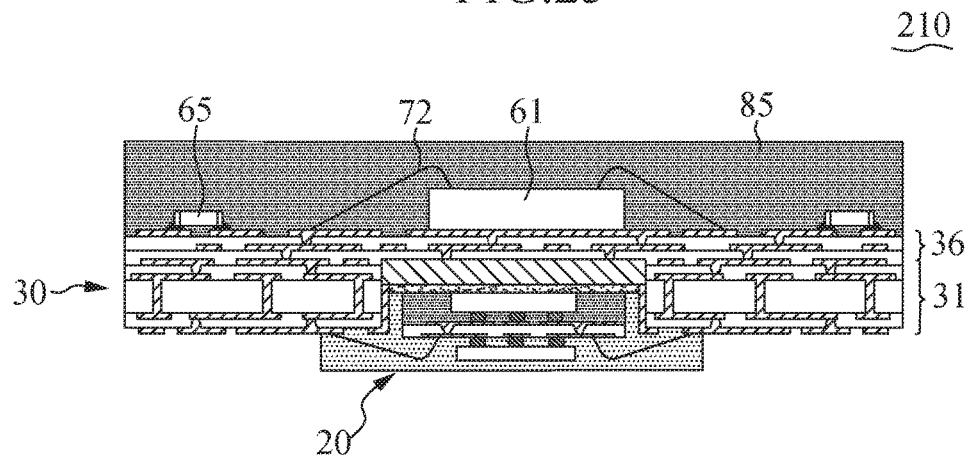
FIG. 26 is a cross-sectional view of the inverted structure of FIG. 25 further provided with an encapsulant in accordance with the second embodiment of the present invention.

FIG. 26 is a cross-sectional view of the semiconductor assembly 210 of FIG. 25 further provided with an encapsulant 85. The encapsulant 85 covers the bonding wires 72, the third device 61, the passive components 65 and the second wiring structure 36 from above.

Figure 27:
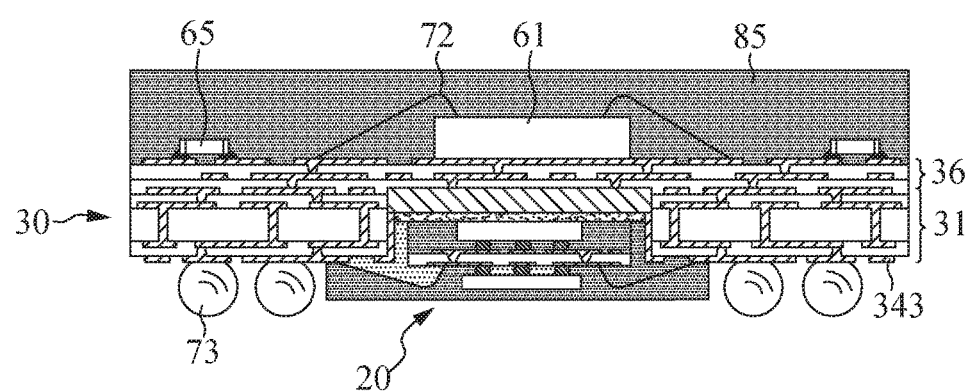
FIG. 27 is a cross-sectional view of the inverted structure of FIG. 26 further provided with solder balls in accordance with the second embodiment of the present invention.

FIG. 27 is a cross-sectional view of the semiconductor assembly 210 of FIG. 26 further provided with solder balls 73. The solder balls 73 are mounted on the conductive traces 343 of the first wiring structure 31 for external connection.

Embodiment 3

FIGS. 28-31 are schematic views showing a method of making a semiconductor assembly with vertical connecting elements on the wiring board in accordance with the third embodiment of the present invention.

For purposes of brevity, any description in Embodiments above is incorporated herein insofar as the same is applicable, and the same description need not be repeated.

Figure 28:
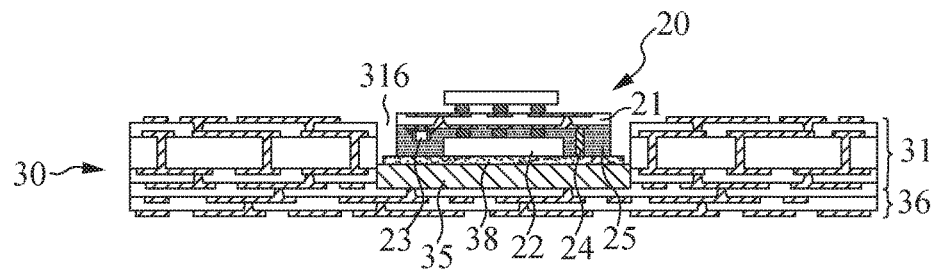
FIG. 28 is a cross-sectional view of the structure with a stacked semiconductor sub-assembly attached to the wiring board of FIG. 10 in accordance with the third embodiment of the present invention.

FIG. 28 is a cross-sectional view of the structure with a stacked semiconductor sub-assembly 20 disposed in the cavity 316 of the wiring board 30 of FIG. 10. The stacked semiconductor sub-assembly 20 is similar to that illustrated in FIG. 7, except that it further includes a passive component 23 and a metal pillar 24 electrically coupled to the routing circuitry 21 and encapsulated in the molding compound 25. The stacked semiconductor sub-assembly 20 is attached on the heat spreader 35 by a thermally and electrically conductive material 38 in contact with the heat spreader 35, the first device 22, the metal pillar 24 and the molding compound 25.

Figure 29:
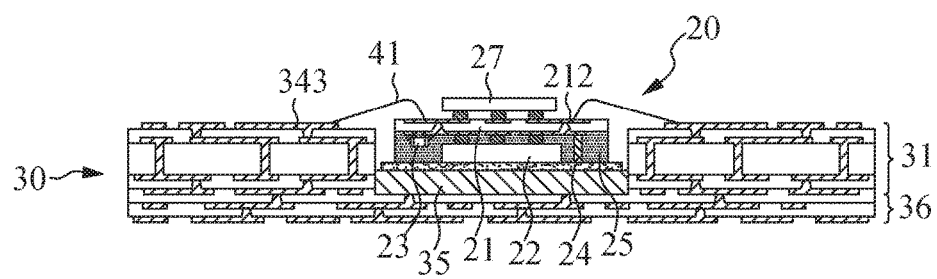
FIG. 29 is a cross-sectional view of the structure of FIG. 28 further provided with bonding wires in accordance with the third embodiment of the present invention.

FIG. 29 is a cross-sectional view of the structure with bonding wires 41 attached to the stacked semiconductor sub-assembly 20 and the wiring board 30. The bonding wires 41 contact and are electrically coupled to the routing traces 212 of the routing circuitry 21 and the conductive traces 343 of the first wiring structure 31.

Figure 30:
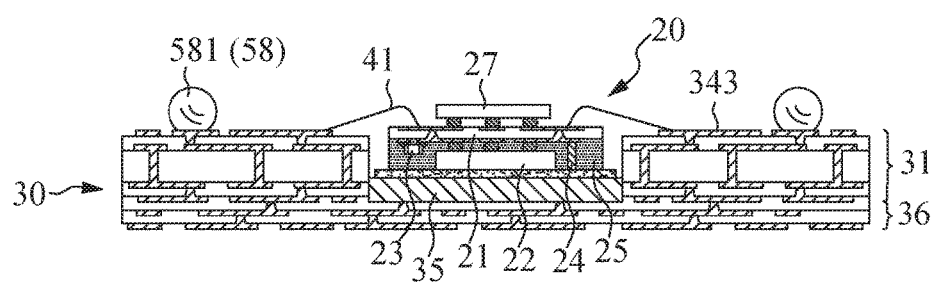
FIG. 30 is a cross-sectional view of the structure of FIG. 29 further provided with vertical connecting elements in accordance with the third embodiment of the present invention.

FIG. 30 is a cross-sectional view of the structure with vertical connecting elements 58 on the wiring board 30. The vertical connecting elements 58 are electrically connected to and contact the conductive traces 343 of the first wiring structure 31. In this examples, the vertical connecting elements 58 are illustrated as solder balls 581.

Figure 31:
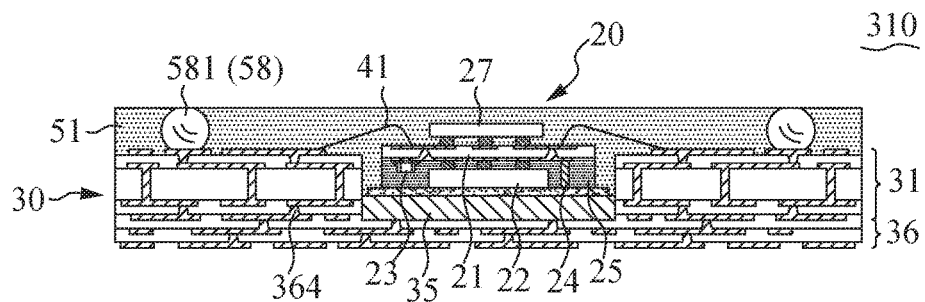
FIG. 31 is a cross-sectional view of the structure of FIG. 30 further provided with an encapsulant to finish the fabrication of a semiconductor assembly in accordance with the third embodiment of the present invention.

FIG. 31 is a cross-sectional view of the structure provided with an encapsulant 51. The encapsulant 51 covers sidewalls of the vertical connecting elements 58 and the bonding wires 41, the stacked semiconductor sub-assembly 20 and the wiring board 30 from above. Accordingly, a semiconductor assembly 310 is accomplished and includes a stacked semiconductor sub-assembly 20, a wiring board 30, bonding wires 41, an encapsulant 51 and vertical connecting elements 58. In this illustration, the stacked semiconductor sub-assembly 20 includes a routing circuitry 21, a first device 22, a passive component 23, a metal pillar 24, a molding compound 25 and a second device 27, whereas the wiring board 30 includes a first wiring structure 31, a heat spreader 35 and a second wiring structure 36.

The first device 22/passive component 23 and the second device 27 are disposed at two opposite sides of the routing circuitry 21 and face-to-face electrically connected to each other through the routing circuitry 21 therebetween. The metal pillar 24 is electrically connected to the routing circuitry 21 and extends through the molding compound 25. The heat spreader 35 is electrically connected to the metal pillar 24 for ground connection and thermally conductible to the first device 22 for heat dissipation. The combination of the first wiring structure 31 and the second wiring structure 36 is electrically coupled to the routing circuitry 21 using the bonding wires 41, and electrically coupled to the heat spreader 35 through metallized vias 364. The vertical connecting elements 58 are mounted on and electrically coupled to the first wiring structure 31 and laterally surrounded by the encapsulant 51.

Figure 32:
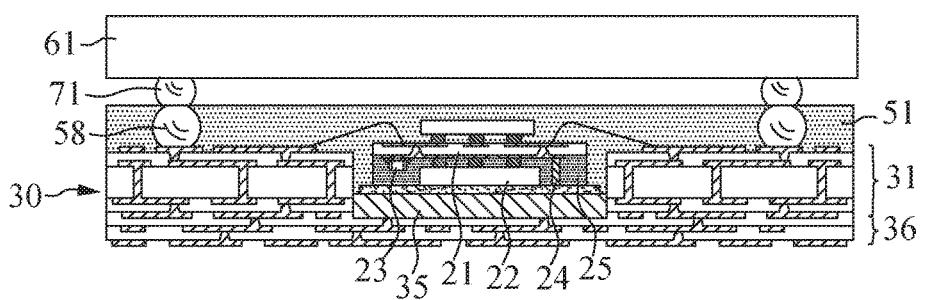
FIG. 32 is a cross-sectional view of the structure of FIG. 31 further provided with a third device in accordance with the third embodiment of the present invention.

FIG. 32 is a cross-sectional view of the semiconductor assembly 310 of FIG. 31 further provided with a third device 61. The third device 61 is stacked over the encapsulant 51, and electrically coupled to the vertical connecting elements 58 in the encapsulant 51 through solder balls 71.

Figure 33:
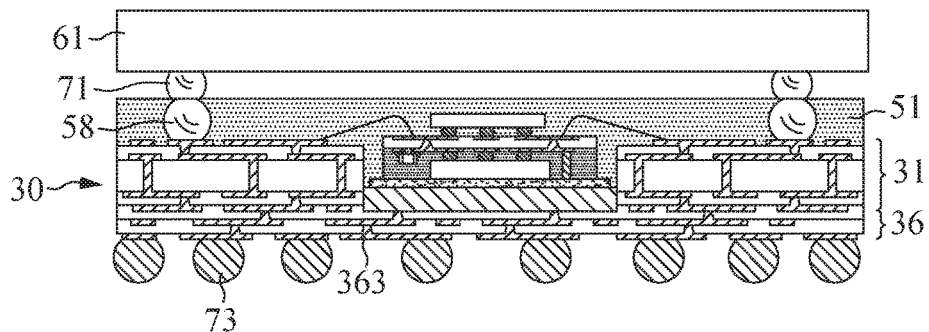
FIG. 33 is a cross-sectional view of the structure of FIG. 32 further provided with solder balls in accordance with the third embodiment of the present invention.

FIG. 33 is a cross-sectional view of the semiconductor assembly 310 of FIG. 32 further provided with solder balls 73. The solder balls 73 are mounted on the conductive traces 363 of the second wiring structure 36 for external connection.

Figure 34:
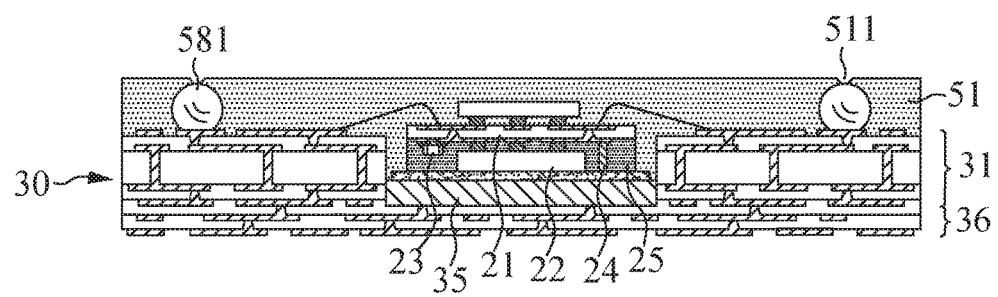
FIG. 34 is a cross-sectional view of another aspect of the semiconductor assembly in accordance with the third embodiment of the present invention.

FIG. 34 is a cross-sectional view of another aspect of the semiconductor assembly according to the third embodiment of the present invention. The semiconductor assembly 320 is similar to that illustrated in FIG. 31, except that the encapsulant 51 has a larger thickness than that of the solder balls 581, and has openings 511 to expose the solder balls 581 from above.

Figure 35:
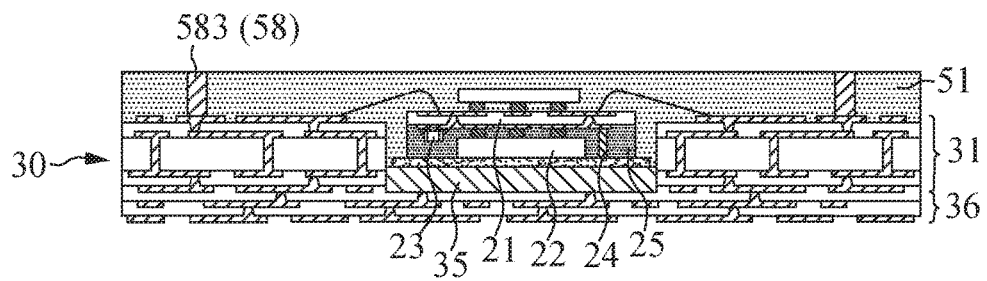
FIG. 35 is a cross-sectional view of yet another aspect of the semiconductor assembly in accordance with the third embodiment of the present invention.

FIG. 35 is a cross-sectional view of yet another aspect of the semiconductor assembly according to the third embodiment of the present invention. The semiconductor assembly 330 is similar to that illustrated in FIG. 31, except that it includes metal posts 583 as the vertical connecting elements 58.

Embodiment 4

Figure 36:
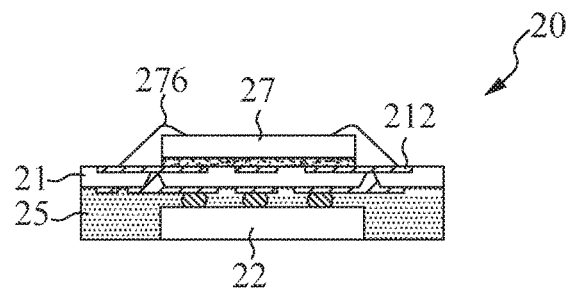
FIG. 36 is a cross-sectional view of a stacked semiconductor sub-assembly in accordance with the fourth embodiment of the present invention.
Figure 37:
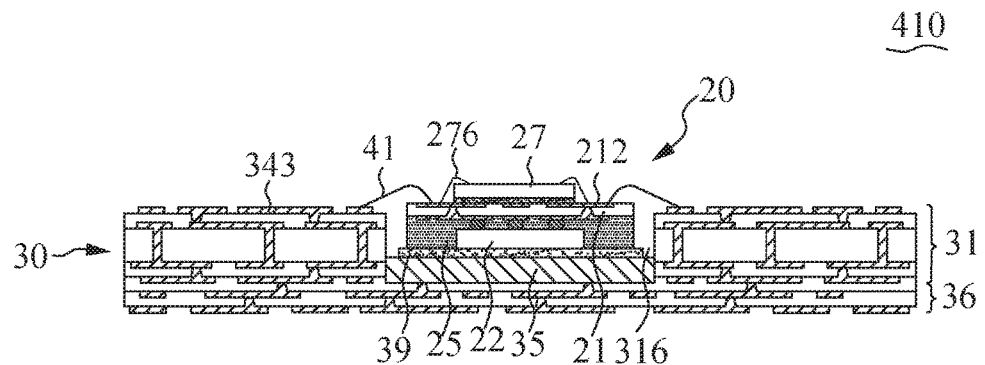
FIG. 37 is a cross-sectional view of the structure with the sub-assembly of FIG. 36 wire bonded to the wiring board 30 of FIG. 10 in accordance with the fourth embodiment of the present invention.

FIGS. 36-37 are schematic views showing a method of making a semiconductor assembly with the second device wire bonded to the routing circuitry in accordance with the fourth embodiment of the present invention.

For purposes of brevity, any description in Embodiments above is incorporated herein insofar as the same is applicable, and the same description need not be repeated.

FIG. 36 is a cross-sectional view of a stacked semiconductor sub-assembly 20. The stacked semiconductor sub-assembly 20 is similar to that illustrated in FIG. 7, except that the second device 27 is electrically coupled to the routing traces 212 of the routing circuitry 21 using bonding wires 276.

FIG. 37 is a cross-sectional view of a semiconductor assembly 410 with the stacked semiconductor sub-assembly 20 of FIG. 36 electrically coupled to the wiring board 30 of FIG. 10 through bonding wires 41. The stacked semiconductor sub-assembly 20 is disposed in the cavity 316 of the wiring board 30 and attached to the heat spreader 35 using a thermally conductive material 39. The bonding wires 41 contact and are electrically coupled to the routing traces 212 of the routing circuitry 21 and the conductive traces 343 of the first wiring structure 31.

Figure 38:
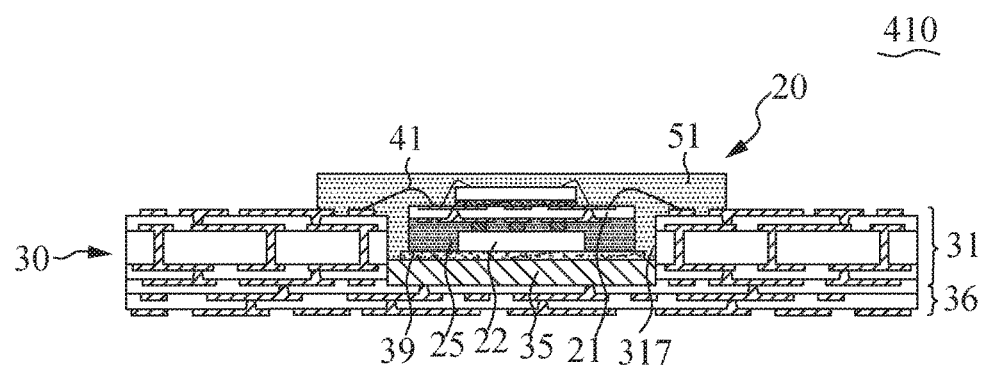
FIG. 38 is a cross-sectional view of the structure of FIG. 37 further provided with an encapsulant in accordance with the fourth embodiment of the present invention.

FIG. 38 is a cross-sectional view of the semiconductor assembly 410 of FIG. 37 further provided with an encapsulant 51. The encapsulant 51 covers the bonding wires 41 and the stacked semiconductor sub-assembly 20 as well as selected portions of the wiring board 30 from above, and further fills up a gap 317 between the peripheral edges of the stacked semiconductor sub-assembly 20 and the interior sidewalls of the wiring board 30.

Figure 39:
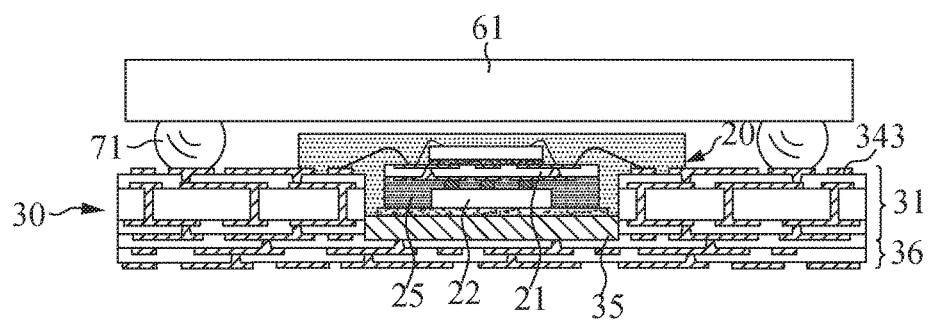
FIG. 39 is a cross-sectional view of the structure of FIG. 38 further provided with a third device in accordance with the fourth embodiment of the present invention.

FIG. 39 is a cross-sectional view of the semiconductor assembly 410 of FIG. 38 further provided with a third device 61 stacked over the stacked semiconductor sub-assembly 20 and the first wiring structure 31 of the wiring board 30. The third device 61 is electrically coupled to the conductive traces 343 of the first wiring structure 31 through solder balls 71.

Figure 40:
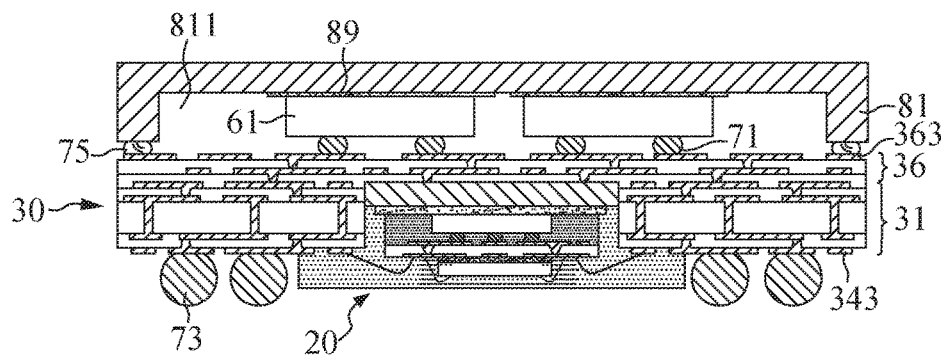
FIG. 40 is a cross-sectional view of the inverted structure of FIG. 38 further provided with third devices, a heat spreader and solder balls in accordance with the fourth embodiment of the present invention.

FIG. 40 is a cross-sectional view of the inverted semiconductor assembly 410 of FIG. 38 further provided with third devices 61 and a heat spreader 81 at the second wiring structure 36 and solder balls 73 at the first wiring structure 31. The third devices 61 are accommodated in a cavity 811 of the heat spreader 81, and electrically coupled to the conductive traces 363 of the second wiring structure 36 by solder balls 71. The heat spreader 81 is thermally conductive to the third devices 61 using a thermally conductive material 89, and electrically coupled to the conductive traces 363 of the second wiring structure 36 by solder balls 75. The solder balls 73 are mounted on the conductive traces 343 of the first wiring structure 31 for external connection.

Embodiment 5

Figure 41:
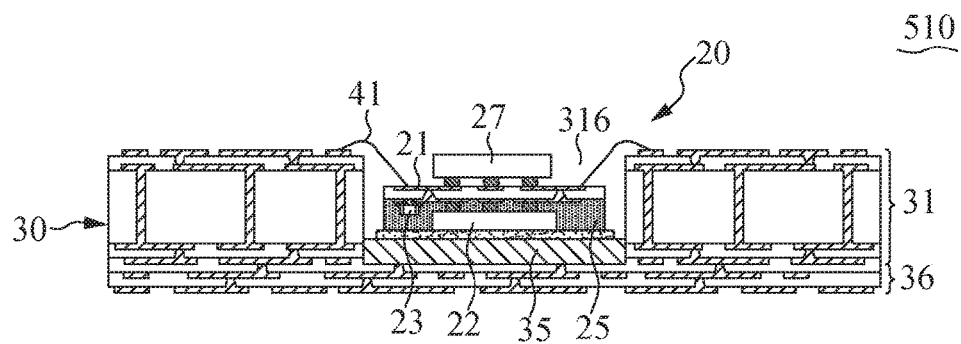
FIG. 41 is a cross-sectional view of a semiconductor assembly in accordance with the fifth embodiment of the present invention.

FIG. 41 is a cross-sectional view of a semiconductor assembly in accordance with the fifth embodiment of the present invention.

The semiconductor assembly 510 is similar to that illustrated in FIG. 12, except that (i) the stacked semiconductor sub-assembly 20 further includes a passive component 23 electrically coupled to the routing circuitry 21 and encapsulated in the molding compound 25, and (ii) the first wiring structure 31 of the wiring board 30 has a larger thickness to create a deeper cavity 316, and the routing circuitry 21 and the second device 27 of the stacked semiconductor sub-assembly 20 also extend into the cavity 316 of the wiring board 30.

Figure 42:
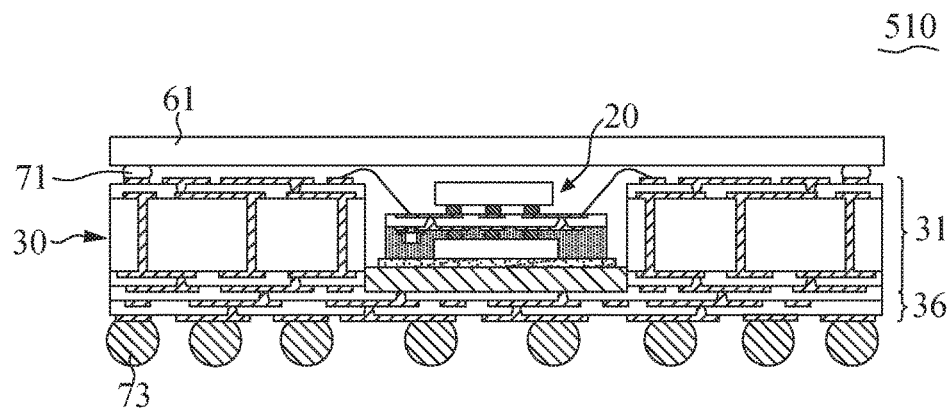
FIG. 42 is a cross-sectional view of the structure of FIG. 41 further provided with a third device and solder balls in accordance with the fifth embodiment of the present invention.

FIG. 42 is a cross-sectional view of the semiconductor assembly 510 of FIG. 41 further provided with a third device 61 at the first wiring structure 31 and solder balls 73 at the second wiring structure 36. The third device 61 is stacked over the stacked semiconductor sub-assembly 20 and the wiring board 30 and electrically coupled to the first wiring structure 31 through solder balls 71. The solder balls 73 are mounted on and electrically coupled to the second wiring structure 36 for external connection.

Figure 43:
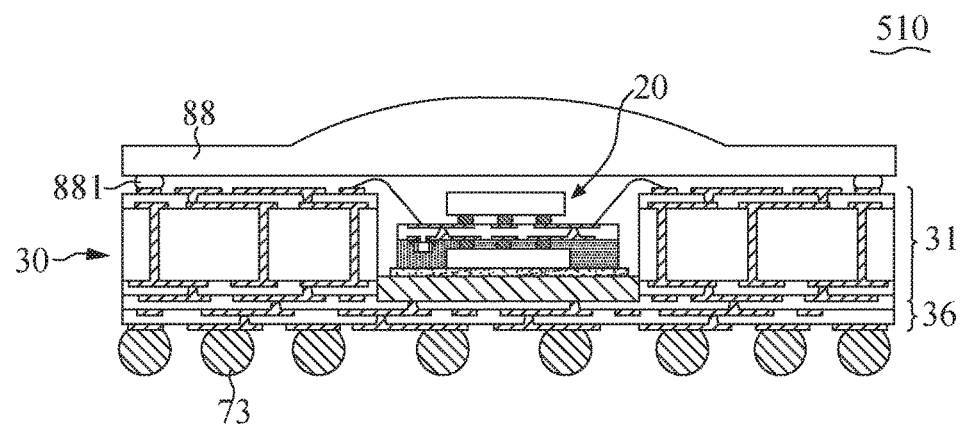
FIG. 43 is a cross-sectional view of the structure of FIG. 41 further provided with a lens and solder balls in accordance with the fifth embodiment of the present invention.

FIG. 43 is a cross-sectional view of the semiconductor assembly 510 of FIG. 41 further provided with a lens 88 at the first wiring structure 31 and solder balls 73 at the second wiring structure 36. The lens 88 optically transparent to at least one range of light wavelengths is stacked over the stacked semiconductor sub-assembly 20 and mounted to the first wiring structure 31 using a joining material 881. The solder balls 73 are mounted on and electrically coupled to the second wiring structure 36 for external connection. The exemplary material of the lens 88 includes, but is not limited to, polycrystalline ceramics (e.g. aluminum oxide ceramics, aluminum oxynitride, perovskytes, polycrystalline yttrium aluminum garnet, etc.), single crystalline ceramics, non-crystalline materials (e.g. inorganic glasses and polymers), and glass ceramics (e.g. silicate based). The joining material 881 may be metal-based material (such as solder), epoxy-based material, polyimide, any other resin or appropriate material.

Embodiment 6

Figure 44:
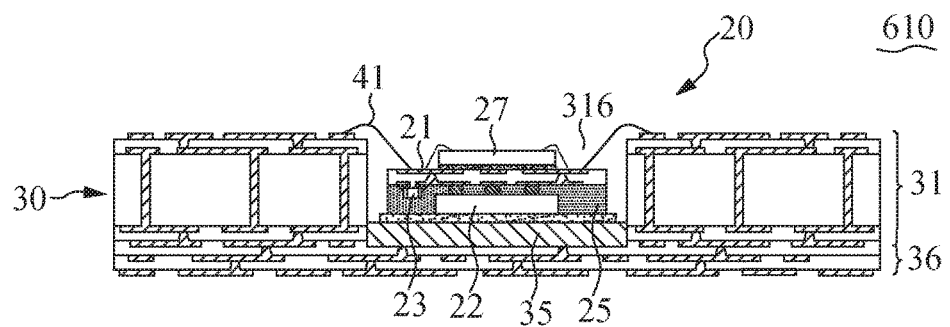
FIG. 44 is a cross-sectional view of a semiconductor assembly in accordance with the sixth embodiment of the present invention.

FIG. 44 is a cross-sectional view of a semiconductor assembly in accordance with the sixth embodiment of the present invention.

The semiconductor assembly 610 is similar to that illustrated in FIG. 37, except that (i) the stacked semiconductor sub-assembly 20 further includes a passive component 23 electrically coupled to the routing circuitry 21 and encapsulated in the molding compound 25, and (ii) the first wiring structure 31 of the wiring board 30 has a larger thickness to create a deeper cavity 316, and the routing circuitry 21 and the second device 27 of the stacked semiconductor sub-assembly 20 also extend into the cavity 316 of the wiring board 30.

Figure 45:
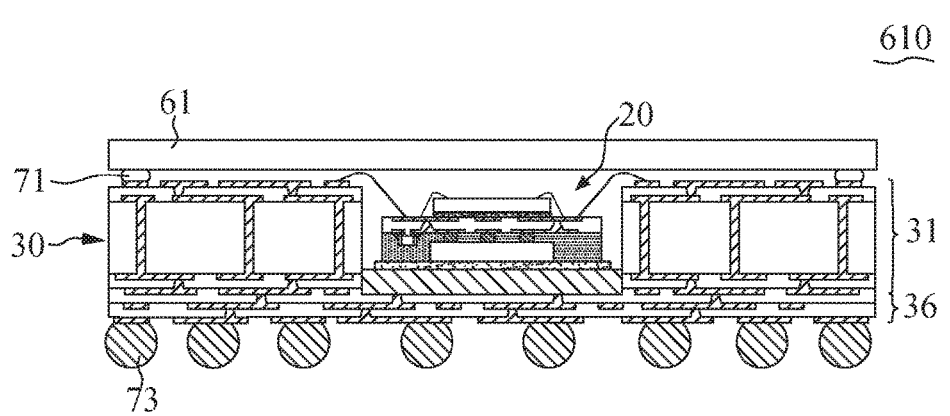
FIG. 45 is a cross-sectional view of the structure of FIG. 44 further provided with a third device and solder balls in accordance with the fifth embodiment of the present invention.

FIG. 45 is a cross-sectional view of the semiconductor assembly 610 of FIG. 44 further provided with a third device 61 at the first wiring structure 31 and solder balls 73 at the second wiring structure 36. The third device 61 is stacked over the stacked semiconductor sub-assembly 20 and the wiring board 30 and electrically coupled to the first wiring structure 31 through solder balls 71. The solder balls 73 are mounted on and electrically coupled to the second wiring structure 36 for external connection.

Figure 46:
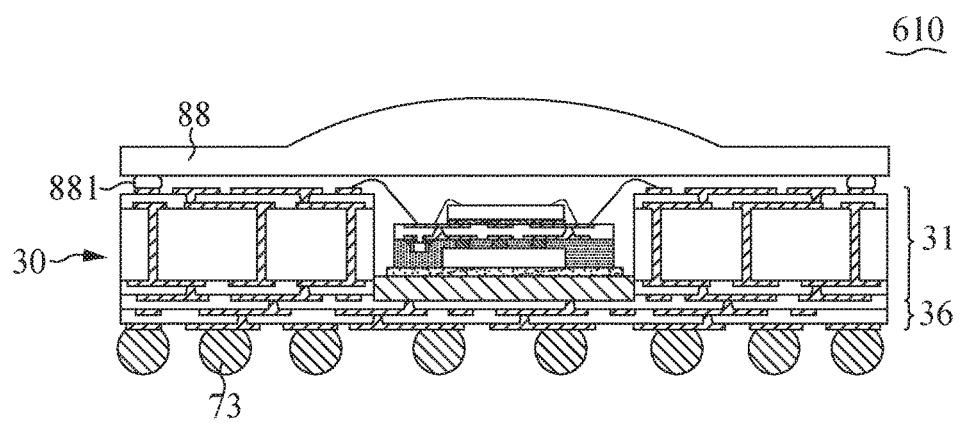
FIG. 46 is a cross-sectional view of the structure of FIG. 44 further provided with a lens and solder balls in accordance with the sixth embodiment of the present invention.

FIG. 46 is a cross-sectional view of the semiconductor assembly 610 of FIG. 44 further provided with a lens 88 at the first wiring structure 31 and solder balls 73 at the second wiring structure 36. The lens 88 optically transparent to at least one range of light wavelengths is stacked over the stacked semiconductor sub-assembly 20 and mounted to the first wiring structure 31. The solder balls 73 are mounted on and electrically coupled to the second wiring structure 36 for external connection.

The semiconductor assemblies described above are merely exemplary. Numerous other embodiments are contemplated. In addition, the embodiments described above can be mixed-and-matched with one another and with other embodiments depending on design and reliability considerations. For instance, the first wiring structure may have multiple through openings in an array and each stacked semiconductor sub-assembly is accommodated in its corresponding through opening. Also, the first wiring structure of the wiring board can include additional conductive traces to receive and route additional stacked semiconductor sub-assemblies.

As illustrated in the aforementioned embodiments, a distinctive semiconductor assembly is configured and includes a stacked semiconductor sub-assembly electrically coupled to a wiring board by bonding wires. Optionally, an encapsulant may be further provided to cover the bonding wires. For the convenience of below description, the direction in which the first surfaces of the routing circuitry and the first wiring structure face is defined as the first direction, and the direction in which the second surfaces of the routing circuitry and the first wiring structure faces is defined as the second direction.

The stacked semiconductor sub-assembly includes a first device, a second device, a routing circuitry and optionally a molding compound, and may be prepared by the steps of: electrically coupling the first device to the first surface of the routing circuitry detachably adhered over a sacrificial carrier by, for example, bumps; optionally providing the molding compound over the routing circuitry; removing the sacrificial carrier from the routing circuitry; and electrically coupling the second device to the second surface of the routing circuitry by, for example, bumps or bonding wires. As a result, the first and second devices, respectively disposed over the first and second surfaces of the routing circuitry, can be electrically connected to each other by the routing circuitry.

The first and second devices can be semiconductor chips, packaged devices, or passive components. The first device can be electrically coupled to the routing circuitry by a well-known flip chip bonding process with its active surface facing in the routing circuitry using bumps without metallized vias in contact with the first device. Likewise, after removal of the sacrificial carrier, the second device can be electrically coupled to the routing circuitry by a well-known flip chip bonding process with its active surface facing in the routing circuitry using bumps without metallized vias in contact with the second device. Alternatively, the second device is electrically coupled to the routing circuitry by wire bonding process with its active surface facing away the routing circuitry.

The routing circuitry can be a buildup circuitry without a core layer to provide primary fan-out routing/interconnection and the shortest interconnection distance between the first and second devices. Preferably, the routing circuitry is a multi-layered buildup circuitry and can include at least one dielectric layer and conductive traces that fill up via openings in the dielectric layer and extend laterally on the dielectric layer. The dielectric layer and the conductive traces are serially formed in an alternate fashion and can be in repetition when needed. Accordingly, the routing circuitry can be formed with electrical contacts at its first and second surfaces for first device connection from the first surface and second device connection and next-level connection from the second surface.

The wiring board includes a heat spreader, a first wiring structure and a second wiring structure. The first wiring structure includes electrical contacts at its second surface for the routing circuitry connection from the second direction, whereas the second wiring structure includes electrical contacts at its exterior surface for next-level connection from the first direction. The first wiring structure has a through opening extending from its first surface to its second surface to accommodate the heat spreader and the stacked semiconductor sub-assembly therein. The first wiring structure is not limited to a particular structure, and may be a multi-layered routing circuitry that laterally surround peripheral edges of the first device, the optional molding material and the heat spreader. For instance, the first wiring structure may include an interconnect substrate, a first buildup circuitry and a second buildup circuitry. The first and second buildup circuitries are disposed on both opposite sides of the interconnect substrate. The interconnect substrate can include a core layer, first and second routing layers respectively on both opposite sides of the core layer, and metallized through vias formed through the core layer to provide electrical connection between the first and second routing layers. Each of the first and second buildup circuitries typically includes a dielectric layer and one or more conductive traces. The dielectric layers of the first and second buildup circuitries are respectively deposited on opposite sides of the interconnect substrate. The conductive traces extend laterally on the dielectric layer and include conductive vias in contact with first and second routing layers of the interconnect substrate. Further, the first and second buildup circuitries can include additional dielectric layers, additional via openings, and additional conductive traces if needed for further signal routing. Accordingly, the outmost conductive traces at both the first and second surfaces of the first wiring structure can provide electrical contacts for the routing circuitry connection from its second surface and for the second wiring structure connection from its first surface. The second wiring structure is provided to cover the backside surface of the heat spreader and the first surface of the first wiring structure, and is electrically coupled to the heat spreader and the first wiring structure by metallized vias embedded in a dielectric layer of the second wiring structure and in contact with the backside surface of the heat spreader and the first surface of the first wiring structure. Accordingly, the heat spreader, covered by the dielectric layer of the second wiring structure from the first direction, can be mechanically supported by the second wiring structure and provide thermal dissipation and EMI shielding for the first device attached thereto using a thermally conductive material. As the heat spreader has a thickness less than that of the first wiring structure, a cavity is formed in the wiring board to accommodate the stacked semiconductor sub-assembly therein. Preferably, the heat spreader is a metal layer having peripheral edges adjacent to and attached to sidewalls of the through opening of the first wiring structure. Optionally, an additional metal layer may be further provided in contact with the heat spreader and the sidewalls of the through opening of the first wiring structure and completely cover a remaining portion of sidewalls of the through opening of the first wiring structure. The second wiring structure may be a multi-layered routing circuitry and laterally extends to peripheral edges of the first wiring structure. Preferably, the second wiring structure is a multi-layered buildup circuitry without a core layer, and includes dielectric layers and conductive traces in repetition and alternate fashion. The conductive traces include metallized vias in the dielectric layer and extend laterally on the dielectric layer. The outmost conductive traces of the first and second wiring structures can respectively accommodate conductive joints, such as solder balls or bonding wires, for electrical communication and mechanical attachment with an assembly, an electronic device, an additional heat spreader, an additional wiring board or others. For instance, a third device may be a semiconductor chip and mounted over and electrically coupled to the second wiring structure through a plurality of bonding wires, or be a ball grid array package or a bumped chip and mounted over and electrically coupled to the first wiring structure or the second wiring structure through a plurality of solder balls. As another aspect of the present invention, an additional heat spreader may be mounted over the second surface of the first wiring structure, and the second device can be disposed in a cavity of the additional heat spreader and thermally conductible to the additional heat spreader through a thermally conductive material. Further, the additional heat spreader may be electrically coupled to the first wiring structure for ground connection by, for example, solder balls in contact with the additional heat spreader and the outmost conductive traces of the first wiring structure. Alternatively, an additional wiring board may be stacked over the stacked semiconductor sub-assembly and the wiring board and electrically coupled to the first wiring structure from the second surface of the first wiring structure. More specifically, the additional wiring board can include a third wiring structure, a fourth wiring structure and an additional heat spreader. The third wiring structure has a through opening extending from its first surface to its second surface to accommodate the additional heat spreader and the second device therein. Preferably, the third wiring structure is a multi-layered routing circuitry and laterally surround peripheral edges of the additional heat spreader and a selected portion of the sub-assembly outside of the through opening. For instance, the third wiring structure may include an interconnect substrate having a core layer, routing layers respectively on both opposite sides of the core layer, and metallized through vias formed through the core layer to provide electrical connection between both the routing layers. Alternatively, the third wiring structure may be a multi-layered buildup circuitry without a core layer, and includes dielectric layers and conductive traces in repetition and alternate fashion. In any case, the third wiring structure can include electrical contacts at its opposite first and second surfaces for electrical connection with the first wiring structure and with the fourth wiring structure. Accordingly, the third wiring structure can be electrically coupled to the first wiring structure by, for example, solder balls, between the second surface of the first wiring structure and the first surface of the third wiring structure, whereas the fourth wiring structure can be electrically coupled to the second surface of the third wiring structure by metallized vias. Further, the fourth wiring structure is also electrically coupled to the heat spreader disposed in the through opening of the third wiring structure by metallized vias for ground connection. As a result, when the second device of the sub-assembly is disposed in the through opening of the third wiring structure, the heat spreader of the additional wiring board can provide thermal dissipation and EMI shielding for the second device attached thereto using a thermally conductive material. Preferably, the fourth wiring structure is a multi-layered routing circuitry and laterally extends to peripheral edges of the third wiring structure. For instance, the fourth wiring structure may be a multi-layered buildup circuitry without a core layer, and include dielectric layers and conductive trace in repetition and alternate fashion. As a result, the fourth wiring structure can include conductive traces at its exterior surface to provide electrical contacts from the second direction, and a third device may be optionally stacked over and electrically coupled to the exterior surface of the fourth wiring structure. Additionally, when the stacked semiconductor sub-assembly is an optical sub-assembly, a lens optically transparent to at least one range of light wavelengths may be stacked over the sub-assembly and mounted on the first wiring structure of the wiring board.

The bonding wires provide electrical connections between the routing circuitry of the sub-assembly and the first wiring structure of the wiring board. In a preferred embodiment, the bonding wires contact and are attached to the second surface of the routing circuitry exposed from the through opening of the first wiring structure and the second surface of the first wiring structure. As a result, the first and second devices can be electrically connected to the wiring board for external connection through the routing circuitry and the bonding wires.

Optionally, an array of vertical connecting elements may be further provided in electrical connection with the wiring board for next-level connection. Preferably, the vertical connecting elements contact and are electrically coupled to the first wiring structure from the second surface of the first wiring structure. The vertical connecting elements can include metal posts, solder balls or others, and may be laterally covered by an encapsulant. As the vertical connecting elements have a selected portion not covered by the encapsulant, a third device can be further provided to be electrically coupled to the vertical connecting elements.

The term "cover" refers to incomplete or complete coverage in a vertical and/or lateral direction. For instance, in a preferred embodiment, the heat spreader covers the first device in the first direction regardless of whether another element such as the thermally conductive material is between the first device and the heat spreader.

The phrases "attached to", "attached on", "mounted to" and "mounted on" includes contact and non-contact with a single or multiple element(s). For instance, in a preferred embodiment, the peripheral edges of the heat spreader are attached to the sidewalls of the through opening regardless of whether the peripheral edges of the heat spreader contact the sidewalls of the through opening or are separated from the sidewalls of the through opening by an adhesive.

The phrases "electrical connection", "electrically connected" and "electrically coupled" refer to direct and indirect electrical connection. For instance, in a preferred embodiment, the bonding wires directly contact and are electrically connected to the first wiring structure, and the routing circuitry is spaced from and electrically connected to the first wiring structure by the bonding wires.

The "first direction" and "second direction" do not depend on the orientation of the semiconductor assembly, as will be readily apparent to those skilled in the art. For instance, the first surfaces of the routing circuitry and the first wiring structure face the first direction and the second surfaces of the routing circuitry and the first wiring structure face the second direction regardless of whether the semiconductor assembly is inverted. Thus, the first and second directions are opposite one another and orthogonal to the lateral directions. Furthermore, the first direction is the upward direction and the second direction is the downward direction when the outer surface of the second wiring structure faces in the upward direction, and the first direction is the downward direction and the second direction is the upward direction when the outer surface of the second wiring structure faces in the downward direction.

The semiconductor assembly according to the present invention has numerous advantages. For instance, the first and second devices are mounted on opposite sides of the routing circuitry, which can offer the shortest interconnect distance between the first and second devices. The routing circuitry provides primary fan-out routing/interconnection for the first and second devices, whereas the wiring board provides a second level fan-out routing/interconnection. As the routing circuitry of the sub-assembly are connected to the first wiring structure of the wiring board by bonding wires, not by direct build-up process, the simplified process steps result in lower manufacturing cost. The heat spreader can provide thermal dissipation, electromagnetic shielding and moisture barrier for the first device. The second wiring structure can provide mechanical support for the heat spreader and dissipate heat from the heat spreader. The semiconductor assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A thermally enhanced semiconductor assembly with three dimensional integration, comprising:
 a stacked semiconductor sub-assembly that includes a first device, a second device, a molding compound and a routing circuitry, wherein the first device is electrically coupled to a first surface of the routing circuitry and the second device is electrically coupled to a second surface of the routing circuitry opposite to the first surface, the molding compound covers the first surface of the routing circuitry and surrounds and conformally coats and covers sidewalls of the first device, peripheral edges of the routing circuitry and peripheral edges of the molding compound together define peripheral edges of the stacked semiconductor sub-assembly, and the second device does not laterally extend beyond the peripheral edges of the stacked semiconductor sub-assembly;
 a wiring board that includes a first wiring structure, a second wiring structure and a heat spreader, wherein (i) the first wiring structure has a first surface, an opposite second surface, and a through opening extending from the first surface and to the second surface, (ii) the heat spreader is disposed in the through opening and has a backside surface substantially coplanar with the first surface of the first wiring structure, (iii) the second wiring structure is disposed on the backside surface of the heat spreader and the first surface of the first wiring structure and electrically connected to the first wiring structure and thermally conductible to the heat spreader through metallized vias, and (iv) the stacked semiconductor sub-assembly is disposed in the through opening such that the peripheral edges of the stacked semiconductor sub-assembly are laterally surrounded by and spaced from interior sidewalls of the through opening; and a plurality of bonding wires that electrically couple the routing circuitry to the wiring board.

2. The semiconductor assembly of claim 1, wherein the heat spreader has peripheral edges adjacent to sidewalls of the through opening and has a thickness less than a depth of the through opening, and the stacked semiconductor sub-assembly is attached on the heat spreader by the first device using a thermally conductive material.

3. The semiconductor assembly of claim 1, further comprising a third device that is stacked over and electrically coupled to the first wiring structure or the second wiring structure.

4. The semiconductor assembly of claim 1, further comprising an encapsulant that covers the plurality of the bonding wires.

5. The semiconductor assembly of claim 1, further comprising a lens disposed over the stacked semiconductor sub-assembly and mounted to the first wiring structure, wherein the lens is optically transparent to at least one range of light wavelengths.

6. The semiconductor assembly of claim 1, further comprising an additional wiring board stacked over the first wiring structure, the additional wiring board including a third wiring structure, a fourth wiring structure and an additional heat spreader, wherein (i) the third wiring structure has a first surface, an opposite second surface, and a through opening extending from the first surface to the second surface; (ii) the additional heat spreader is disposed in the through opening and has a backside surface substantially coplanar with the second surface of the third wiring structure, (iii) the fourth wiring structure is disposed on the backside surface of the additional heat spreader and the second surface of the third wiring structure and electrically connected to the third wiring structure and thermally conductible to the additional heat spreader through metallized vias, and (iv) the second device is attached to the additional heat spreader and laterally surrounded by the third wiring structure, whereas the third wiring structure is electrically coupled to the first wiring structure.

7. The semiconductor assembly of claim 1, further comprising another heat spreader electrically coupled to the first wiring structure and thermally conductible to the second device.

* * * * *